United States Patent
Shimabukuro et al.

(10) Patent No.: US 9,911,790 B1
(45) Date of Patent: Mar. 6, 2018

(54) RESISTIVE RAM INCLUDING AIR GAPS BETWEEN WORD LINES AND BETWEEN VERTICAL BIT LINES

(71) Applicant: SANDISK TECHNOLOGIES LLC, Plano, TX (US)

(72) Inventors: Seiji Shimabukuro, Yokkaichi (JP); Michiaki Sano, Yokkaichi (JP); Kan Fujiwara, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/411,152

(22) Filed: Jan. 20, 2017

(51) Int. Cl.
*H01L 27/24* (2006.01)
*H01L 45/00* (2006.01)

(52) U.S. Cl.
CPC ........ *H01L 27/249* (2013.01); *H01L 27/2454* (2013.01); *H01L 45/065* (2013.01); *H01L 45/085* (2013.01); *H01L 45/1233* (2013.01); *H01L 45/1253* (2013.01); *H01L 45/141* (2013.01); *H01L 45/145* (2013.01); *H01L 45/1675* (2013.01)

(58) Field of Classification Search
CPC .......................... H01L 27/249; H01L 27/2454
See application file for complete search history.

(56) References Cited

U.S. PATENT DOCUMENTS

| 5,915,167 | A | 6/1999 | Leedy |
| 8,658,499 | B2 | 2/2014 | Makala et al. |
| 9,343,507 | B2 | 5/2016 | Takaki |
| 9,356,031 | B2 | 5/2016 | Lee et al. |
| 9,419,012 | B1 | 8/2016 | Shimabukuro et al. |
| 9,449,982 | B2 | 9/2016 | Lu et al. |
| 9,576,975 | B2 | 2/2017 | Zhang et al. |
| 2013/0043455 | A1 | 2/2013 | Bateman |

(Continued)

FOREIGN PATENT DOCUMENTS

WO  WO 2007004843 A1  1/2007

OTHER PUBLICATIONS

U.S. Appl. No. 14/815,296, filed Sep. 11, 2015, SanDisk Technologies, LLC.

(Continued)

*Primary Examiner* — Allison P Bernstein
(74) *Attorney, Agent, or Firm* — The Marbury Law Group PLLC

(57) ABSTRACT

A plurality of alternating stacks laterally spaced apart by line trenches is provided over a substrate. Each alternating stack includes respective word lines and respective dielectric material layers. An alternating sequence of vertical bit lines and inter-bit-line cavities is formed within each of the line trenches. Resistive memory material layers including resistive memory elements are provided at intersection regions between the word lines and the vertical bit lines. Air gaps are formed by removing at least a predominant portion of each of the dielectric material layers selective to the word lines, the vertical bit lines, and the resistive memory material layers, thereby forming a plurality of alternating stacks of the word lines and air gaps. A dielectric isolation layer including vertically-extending voids can be formed over the plurality of alternating stacks in the inter-bit-line cavities.

20 Claims, 26 Drawing Sheets

(56) References Cited

U.S. PATENT DOCUMENTS

2013/0229846 A1* 9/2013 Chien ................. H01L 27/2454
                                                           365/51
2016/0064532 A1   3/2016 Makala et al.
2016/0293839 A1* 10/2016 Suzuki .................... H01L 45/06

OTHER PUBLICATIONS

U.S. Appl. No. 14/924,144, filed Oct. 27, 2015, SanDisk Technologies, LLC.
U.S. Appl. No. 15/228,216, filed Aug. 4, 2016, SanDisk Technologies, LLC.
U.S. Appl. No. 15/251,818, filed Aug. 30, 2016, SanDisk Technologies, LLC.

* cited by examiner

RESISTIVE RAM INCLUDING AIR GAPS BETWEEN WORD LINES AND BETWEEN VERTICAL BIT LINES

FIELD

The present disclosure relates generally to the field of semiconductor devices and specifically to three-dimensional non-volatile memory devices, such as a three-dimensional resistive random access memory (ReRAM) devices, and methods of making the same.

BACKGROUND

Resistance Random Access Memory, or "ReRAM," is a non-volatile memory device employing reversible change in resistance in a thin film with application of electrical voltage bias across the film. Application of the electrical voltage bias in one manner can cause decrease in the resistance of the thin film, for example, by formation of filaments that function as leakage current paths or by increasing a crystallinity of the thin film. Application of a different type of electrical voltage bias can cause reversal of the resistance of the thin film to an original high-resistance state, such as by removal of the filaments from the thin film or by decreasing the crystallinity of the thin film.

Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

A barrier-modulated cell (BMC) resistive random access memory (ReRAM) device is a ReRAM in which the resistance of a resistive memory element is modulated by separation or recombination of oxygen vacancies and oxygen ions. When the oxygen ions combine with the oxygen vacancies, a zone with a low density of charge carriers is formed, thereby increasing the resistance of the resistive memory element. This operation is herein referred to as a "resetting" operation. When the oxygen ions are separated from the oxygen vacancies, a zone with a high density of charge carriers is formed, thereby decreasing the resistance of the resistive memory element. This operation is herein referred to as a "setting" operation.

A filament-modulated cell (FMC) resistive random access memory (ReRAM) device is a ReRAM in which the resistance of a resistive memory element is modulated by presence of absence of conductive filaments within a dielectric oxide material. A high voltage applied in the forward direction forms conductive filaments, and a high voltage applied in the reverse direction removes the conductive filaments.

A phase-change material (PCM) resistive random access memory (ReRAM) device is a ReRAM in which the resistance of a resistive memory element is modulated by change of its phase or crystalline state based on the application of a voltage. For example, resistive memory element material may comprise a chalcogenide phase change material.

SUMMARY

According to an aspect of the present disclosure, a resistive memory device is provided, which comprises: a plurality of alternating stacks located over a substrate, wherein each of the plurality of alternating stacks comprises word lines and air gaps; a two-dimensional array of vertical bit lines extending along a vertical direction and located among the plurality of alternating stacks; and resistive memory material layers including resistive memory elements located at intersection regions between the word lines and the two-dimensional array of vertical bit lines.

According to another aspect of the present disclosure, a method of forming a resistive memory device is provided. A plurality of alternating stacks laterally spaced apart by line trenches extending along a first horizontal direction is formed over a substrate. Each alternating stack includes respective word lines and respective dielectric material layers. An alternating sequence of vertical bit lines and inter-bit-line cavities is formed within each of the line trenches. Resistive memory material layers including resistive memory elements are formed at intersection regions between the word lines and the vertical bit lines. Air gaps are formed by removing a predominant portion of each of the dielectric material layers selective to the word lines, the vertical bit lines, and the resistive memory material layers to form a plurality of alternating stacks of the word lines and air gaps.

DETAILED DESCRIPTION

Figure 1A:
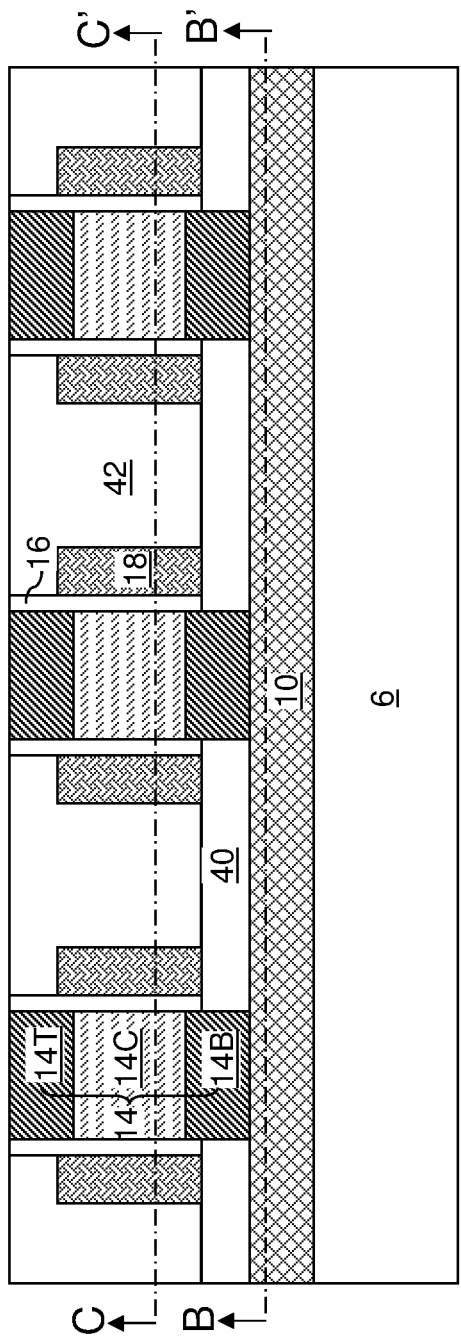
FIG. 1A is a vertical cross-sectional view of an exemplary structure after formation of bit line access transistors and access transistor level dielectric rails according to an embodiment of the present disclosure.

As discussed above, the present disclosure is directed to a three-dimensional resistive random access memory (ReRAM) devices and other three-dimensional devices, and methods of making the same, the various aspects of which are described below. The embodiments of the disclosure can be employed to form various semiconductor devices such as three-dimensional monolithic memory array devices comprising ReRAM devices.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, an "alternating stack" of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses.

As used herein, an "alternating stack" refers to an alternating stack of first elements and second elements in which the first elements are instances of a first type layer and the second elements are instances of a second type layer or air gap. Thus, instances of the first elements alternate with instances of the second elements to form an alternating sequence within the alternating stack. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material", an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. As used herein, a first material is removed "selective to" a second material if the rate of removal of the first material is at least twice (such as at least 10 times) the removal rate of the second material.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

The various three dimensional memory devices of the present disclosure can include a ReRAM device, and can be fabricated employing the various embodiments described herein. It is understood that a criss-cross array of resistive memory elements that can be accessed by any access scheme can be employed for the resistive memory devices of the present disclosure, and the exemplary structures of the present disclosure are described herein merely provide non-limiting examples of implementation of the memory devices of the present disclosure.

Figure 1B:
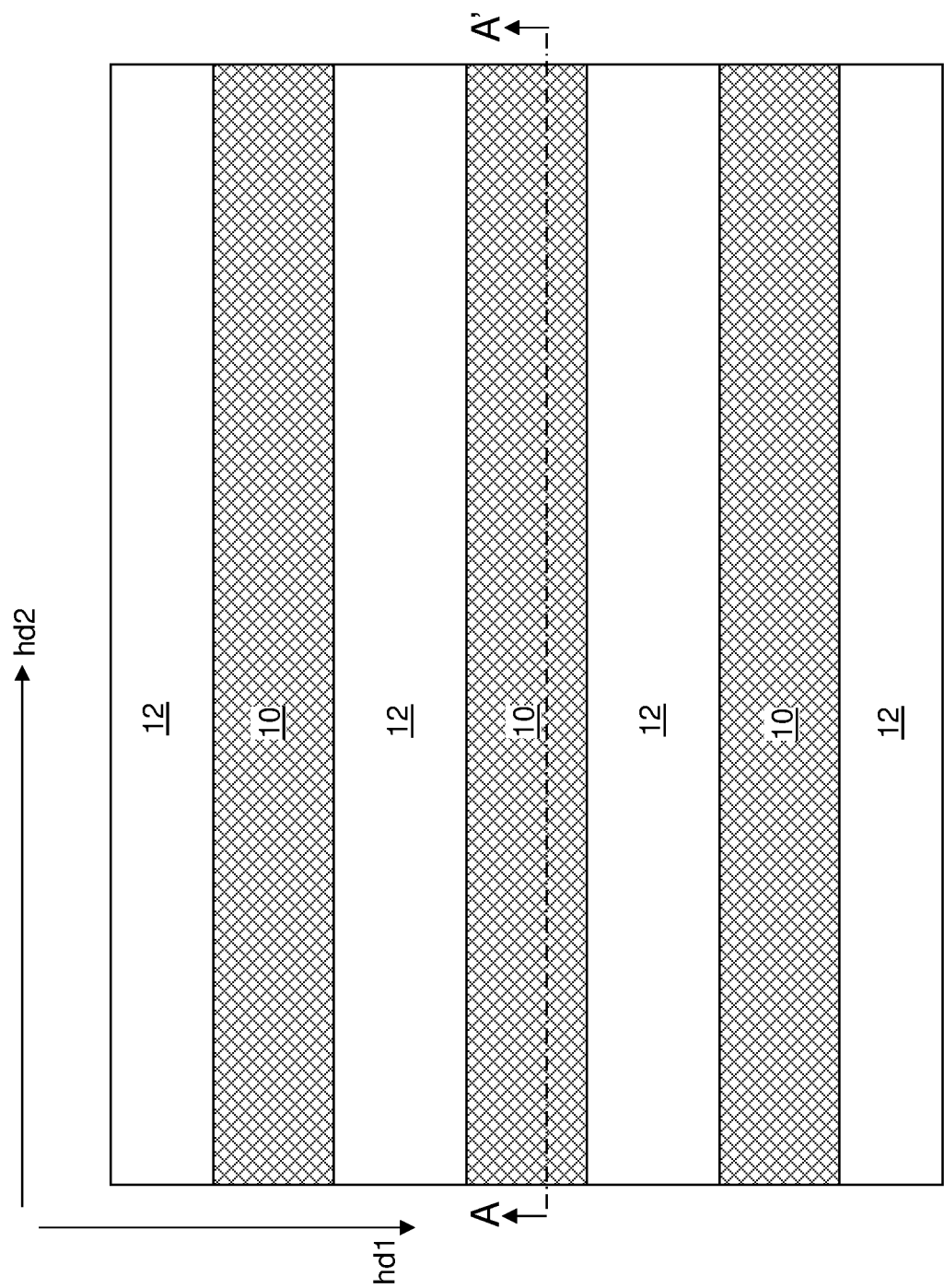
FIG. 1B is a horizontal cross-sectional view of the exemplary structure of FIG. 1A along the horizontal plane B-B'. The vertical plane A-A' is the plane of the cross-section for FIG. 1A.
Figure 1C:
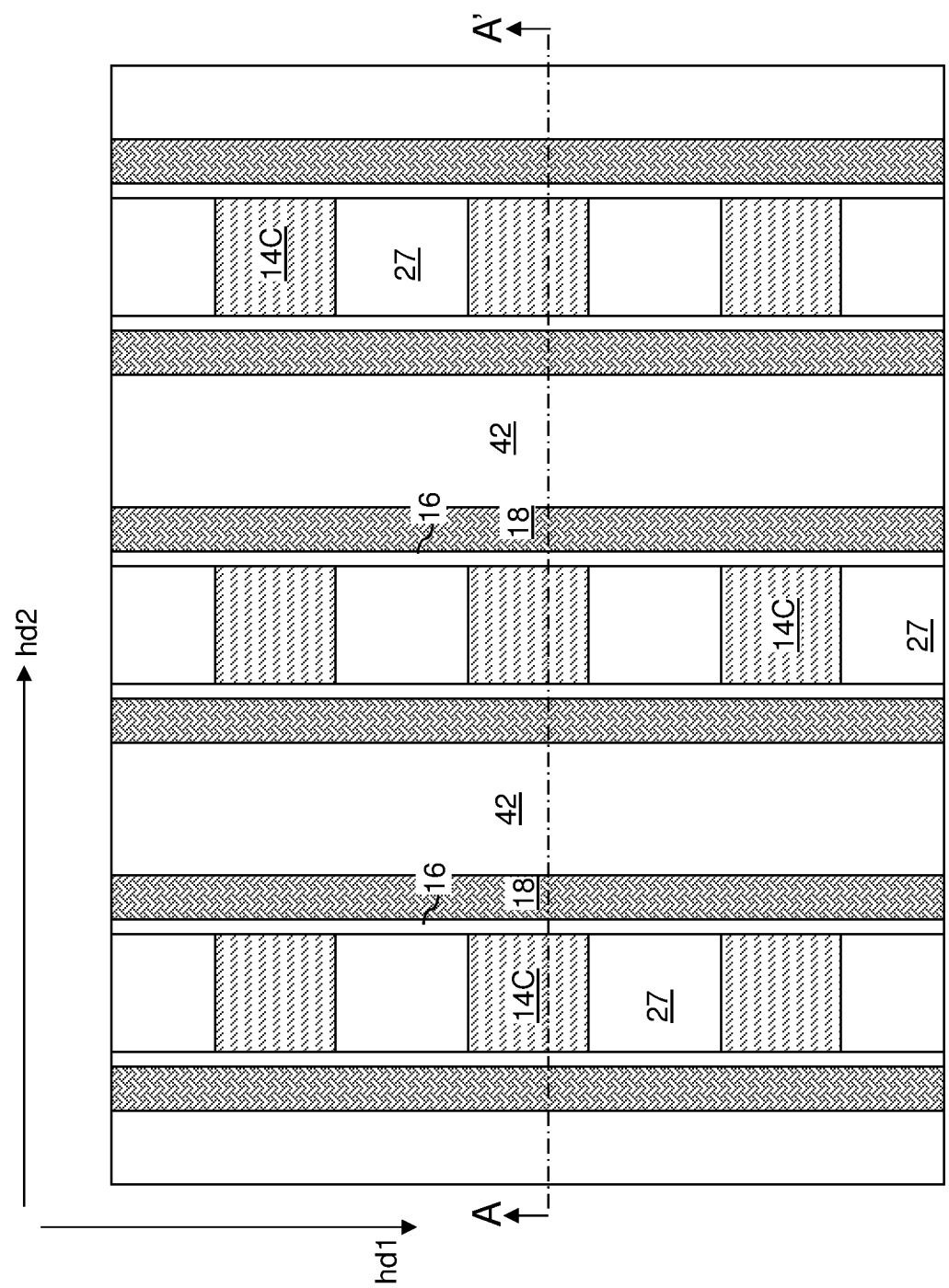
FIG. 1C is a horizontal cross-sectional view of the exemplary structure of FIG. 1A along the horizontal plane C-C'. The vertical plane A-A' is the plane of the cross-section for FIG. 1A.

Referring to FIGS. 1A-1C, an exemplary structure for forming a resistive random access memory device is illustrated, which can be an in-process ReRAM device. As used herein, a "prototype" structure or an "in-process" structure refers to a transient structure that is subsequently modified in the shape or composition of at least one component therein.

The exemplary structure includes a substrate 6, which includes an insulating layer at an upper portion thereof. In one embodiment, the substrate 6 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm. In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense amplifiers, input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

Global bit lines 10 are formed over the substrate 6. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the second horizontal direction hd2. A one-dimensional array of the global bit lines 10 and the separator dielectric material portions 12 can extend along the first horizontal direction hd2 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel. Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to access transistors.

Bit line access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14C is a drain region). As used herein, an "active region" refers to a source region or a drain region.

The bit line access transistors can be formed by forming a semiconductor layer stack 14 including a first doped semiconductor layer for forming the bottom active regions 14B, a semiconductor channel material layer for forming the semiconductor channels 14C, and a second doped semiconductor layer for forming the top active regions 14T, which has a same type of doping as the first semiconductor layer. The semiconductor layer stack 14 is patterned employing a combination of lithographic methods and an anisotropic etch such that each patterned portion of the semiconductor layer stack 14 overlies an area of a respective global bit line 10 and is laterally spaced from one another by trenches extending along the second horizontal direction hd2. Subsequently, a dielectric material (such as silicon nitride and/or silicon oxide) is deposited in the trenches and planarized to remove the dielectric material from above rails of the semiconductor layer stack 14 that extend along the second horizontal direction hd2. The remaining portions of the semiconductor layer stack 14 and the planarized dielectric material portions constitute alternating rail structures in which rails of semiconductor layer stack 14 and rails of the planarized dielectric material extend along the second horizontal direction hd2 and alternate along the first horizontal direction hd1.

The remaining portions of the semiconductor layer stack 14 and the planarized dielectric material portions are patterned to form trenches that extend along the first horizontal direction hd1. Each patterned portion of the semiconductor layer stack 14 includes a vertical stack of a bottom active region 14B, a semiconductor channel 14C, and a top active region 14T. Each patterned portion of the dielectric material constitutes a dielectric pillar structure 27, which can be located between a pair of vertical stacks of a bottom active region 14B, a semiconductor channel 14C, and a top active region 14T that are spaced from each other along the first horizontal direction hd1. Each alternating sequence of dielectric pillar structures 27 and vertical stacks of a bottom active region 14B, a semiconductor channel 14C, and a top active region 14T that extend along the first horizontal direction hd1 forms a composite rail structure (14B, 14C, 14T, 27). The composite rail structures (14B, 14C, 14T, 27) are laterally spaced from one another along the second horizontal direction hd2. Top surfaces of the global bit lines 10 and the separator dielectric portions 12 can be physically exposed at the bottom of each trench that laterally extends along the first horizontal direction hd1.

A spacer dielectric layer 40 can be formed at the bottom the trenches by depositing a self-planarizing dielectric material (such as spin-on glass) or by filling the trenches with a dielectric material (such as organosilicate glass), planarizing the deposited dielectric material, and recessing the dielectric material selective to the dielectric pillar structures 27 and the vertical stacks of the bottom active regions 14B, the semiconductor channels 14C, and the top active regions 14T. Each spacer dielectric layer 40 can be formed over of the global bit lines 10 and the separator dielectric material portions 12 such that the top surface of the spacer dielectric layer 40 is located at a target height for placing a bottom edge of gate electrodes 18 to be subsequently formed. For example, the top surface of the spacer dielectric layer 40 can be at a level about the interface between the remaining portions of the first conductivity type semiconductor layer and the channel material layer.

The gate dielectrics 16 and the gate electrodes 18 of the access transistors can be subsequently formed, for example, by depositing a conformal gate dielectric layer (e.g., silicon oxide) and a conformal conductive material layer (e.g., heavily or degenerately doped polysilicon) in the trenches that separate the one-dimensional array of rail structures, and by anisotropically etching the conformal conductive material layer. The remaining vertical portions of the conformal conductive material layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the trenches are filled with at least one dielectric material. Excess portions of the at least one dielectric material can be removed from above the horizontal plane including the top surfaces of the rail structures (which include contiguous portions of the semiconductor layer stack 14 and the dielectric pillar structures 27 that are present between a pair of trenches) by a planarization process, which can employ, for example, chemical mechanical planarization. Each remaining portion of the deposited dielectric material in the trenches constitutes an access transistor level dielectric rail 42.

Each access transistor level dielectric rail 42 extends along the first horizontal direction hd1 parallel to the composite rail structures (14B, 14C, 14T, 27). Each composite rail structure (14B, 14C, 14T, 27) includes remaining portions of the semiconductor layer stack 14 and the dielectric pillar structures 27 between a neighboring pair of access transistor level dielectric rails 42. Each access transistor level dielectric rail 42 can have a substantially vertical bottom portion, or can have a tapered bottom portion in which the width of the access transistor level dielectric rail 42 monotonically or strictly increases as a function of a vertical distance from the substrate 6. In one embodiment, each access transistor level dielectric rail 42 can include at least one dielectric material such as silicon nitride and/or silicon oxide. The access transistor level dielectric rails 42 and the composite rail structures (14T, 14C, 14B, 27) alternate along the second horizontal direction hd2.

Figure 2A:
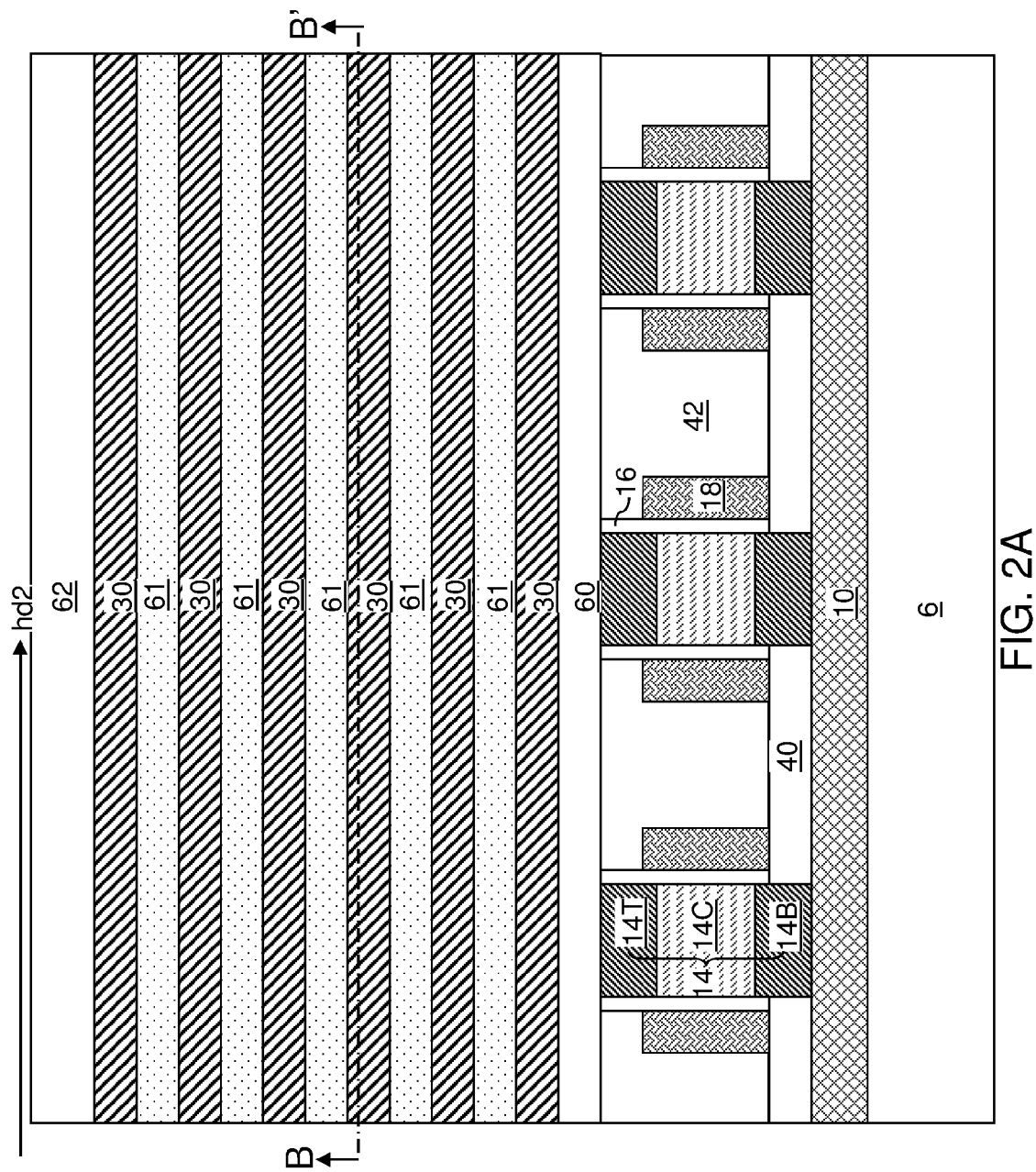
FIG. 2A is a vertical cross-sectional view of the exemplary structure after formation of a bottom insulating layer, an alternating stack of electrically conductive layers and dielectric material layers, and a top insulating layer according to an embodiment of the present disclosure.
Figure 2B:
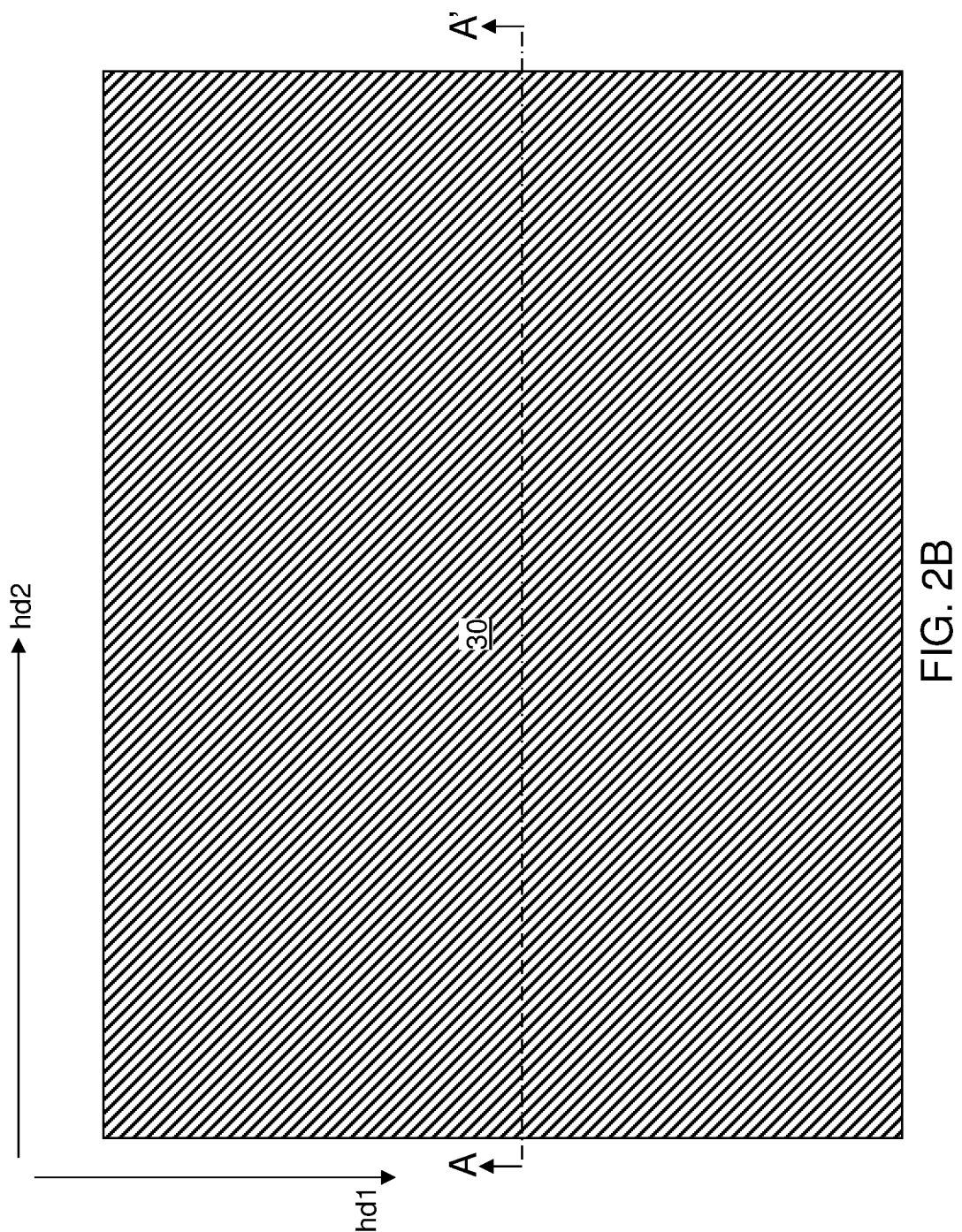
FIG. 2B is a horizontal cross-sectional view of the exemplary structure of FIG. 2A along the horizontal plane B-B'. The vertical plane A-A' is the plane of the cross-section for FIG. 2A.

Referring to FIGS. 2A and 2B, a bottom insulating layer 60, an alternating stack of electrically conductive layers 30 and dielectric material layers 61, and a top insulating layer 62 are sequentially formed over the access transistor level dielectric rails 42 and the composite rail structures (14T, 14C, 14B, 27). In one embodiment, the bottom insulating layer 60 and the top insulating layer 62 can include a dielectric material that has a different composition and/or different deposition method such that it has a lower etch than the dielectric material layers 61 for at least one etching medium. For example, the bottom insulating layer 60 and the top insulating layer 62 can include a dielectric material that has a lower etch rate under exposure to a hydrofluoric acid-based etchant than the dielectric material layers 61.

In one embodiment, the bottom insulating layer 60 and the top insulating layer 62 can include silicon oxide materials having an etch rate in a range from 1.0 times the etch rate of thermal silicon oxide (i.e., silicon oxide formed by thermal oxidation of silicon) to 2.0 times the etch rate of thermal silicon oxide upon exposure to diluted hydrofluoric acid (formed by 100:1 dilution of 49% hydrofluoric acid in water). For example, the etch rate of the bottom insulating layer 60 and the top insulating layer 62 in the diluted hydrofluoric acid can be in a range from about 3 nm per minute to about 6 nm per minute.

At least one of the bottom insulating layer 60 and the top insulating layer 62 may be deposited by low pressure chemical vapor deposition employing tetraethylorthosilicate (TEOS) as a precursor or employing dichlorosilane ($SiCl_2H_2$) and nitrous oxide ($N_2O$) as reactants. If TEOS is employed as a precursor, the silicon oxide materials of the bottom insulating layer 60 and the top insulating layer 62 can include residual carbon at an atomic concentration greater than $1.0\times10^{18}/cm^3$. For example, the atomic concentration of carbon may in a range from than $1.0\times10^{19}/cm^3$ to $2.0\times10^{20}/cm^3$. Alternatively or additionally, at least one of the bottom insulating layer 60 and the top insulating layer 62 may be deposited by plasma enhanced chemical vapor deposition (PECVD) employing dichlorosilane and oxygen as reactants. The thicknesses of the bottom insulating layer 60 and the top insulating layer 62 can be in a range from 30 nm to 600 nm, although lesser and greater thicknesses can also be employed.

The dielectric material layers 61 can include a hydrogen-doped silicon oxide materials having an etch rate greater than 3 times (such as greater than 10 times and/or greater than 30 times) the etch rate of thermal silicon oxide upon exposure to diluted hydrofluoric acid. For example, the etch rate of the dielectric material layers 61 in the diluted hydrofluoric acid can be in a range from about 9 nm per minute to about 900 nm per minute. In one embodiment, the dielectric material layers 61 can include hydrogen atoms at an atomic concentration greater than 1.0 atomic percentage.

In one embodiment, the hydrogen-doped silicon oxide material can be composed of a flowable nitrogen-containing hydrogen-doped silicon oxide that can be deposited by Eterna® flowable chemical vapor deposition (FCVD) system by Applied Materials, Inc. Alternatively, the hydrogen-doped silicon oxide material can include non-porous or porous organosilicate glass including silicon, oxygen, carbon, and hydrogen. Alternatively, the dielectric material layers 61 can include silicon oxide material deposited by spin-on coating using a perhydropolysilazane inorganic spin-on dielectric (PSZ-SOD) source material. The thicknesses of each dielectric material layer 61 can be in a range from 5 nm to 60 nm, although lesser and greater thicknesses can also be employed.

In an alternative embodiment, each dielectric material layer 61 can have the same composition and can be deposited by the same deposition method using the same precursors as the bottom insulating layer 60 and the top insulating layer 62. For example, each dielectric material layer 61 can be deposited by low pressure chemical vapor deposition employing tetraethylorthosilicate (TEOS) as a precursor or employing dichlorosilane ($SiCl_2H_2$) and nitrous oxide ($N_2O$) as reactants.

The electrically conductive layers 30 include an electrically conductive material, which can be an elemental metal (such as W, Ti, Ta, Cu, Al, Ru, or Co), an intermetallic alloy of at least two elemental metals, a conductive metal nitride (such as TiN, WN, or TaN), or a heavily doped semiconductor material having a conductivity greater than $1.0\times10^5$ S/cm (such as doped polysilicon). The thickness of each electrically conductive layer 30 can be in a range from 5 nm to 60 nm, although lesser and greater thicknesses can also be employed. The electrically conductive layer 30 can be deposited by chemical vapor deposition (CVD). The alternating stack of the electrically conductive layers 30 and the dielectric material layers 61 may begin with an instance of the electrically conductive layers, and may terminate with an instance of the electrically conductive layers.

Figure 3A:
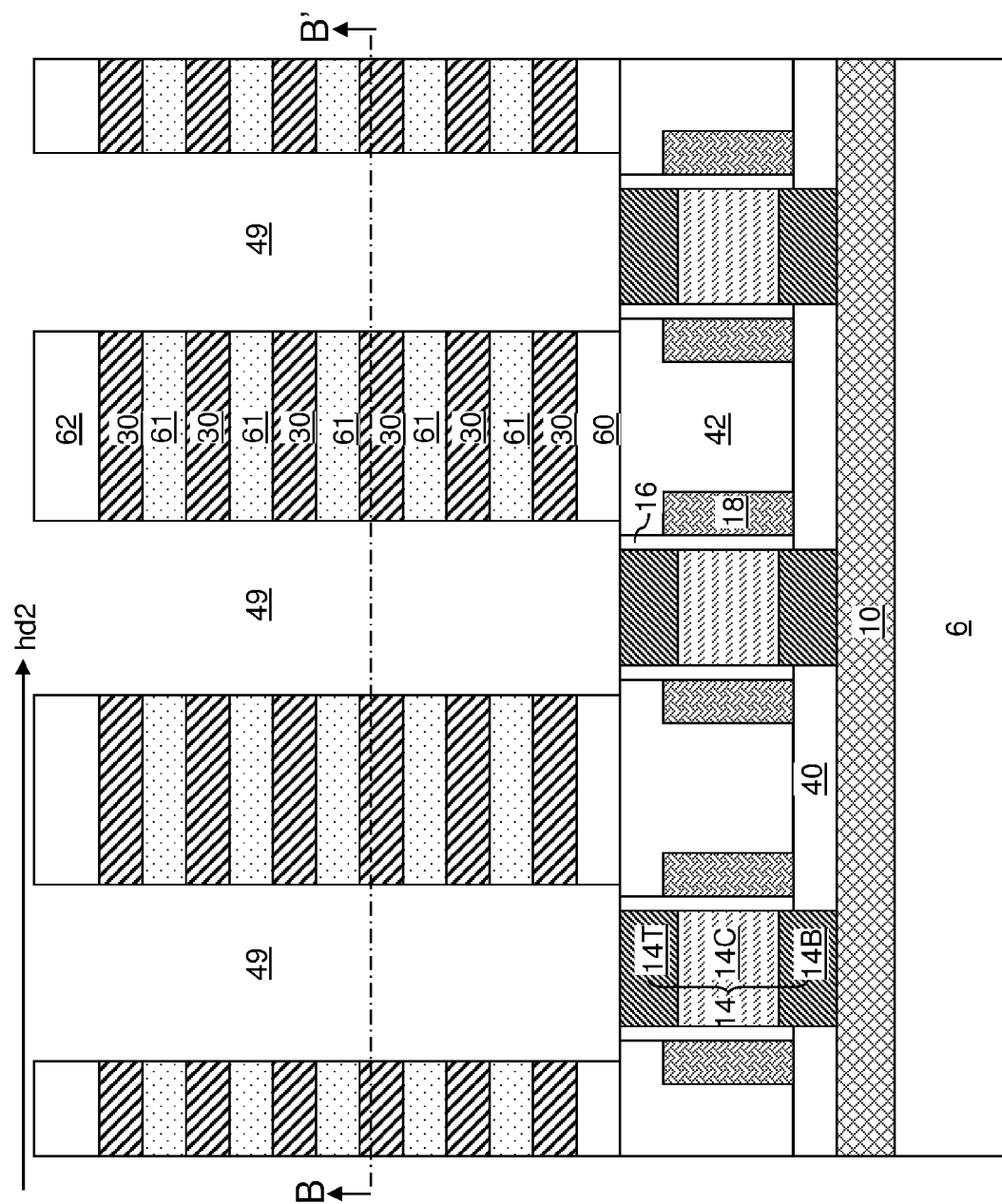
FIG. 3A is a vertical cross-sectional view of the exemplary structure after patterning the alternating stack of electrically conductive layers and dielectric material layers into a plurality of alternating stacks laterally spaced apart by line trenches extending along a first horizontal direction according to an embodiment of the present disclosure.
Figure 3B:
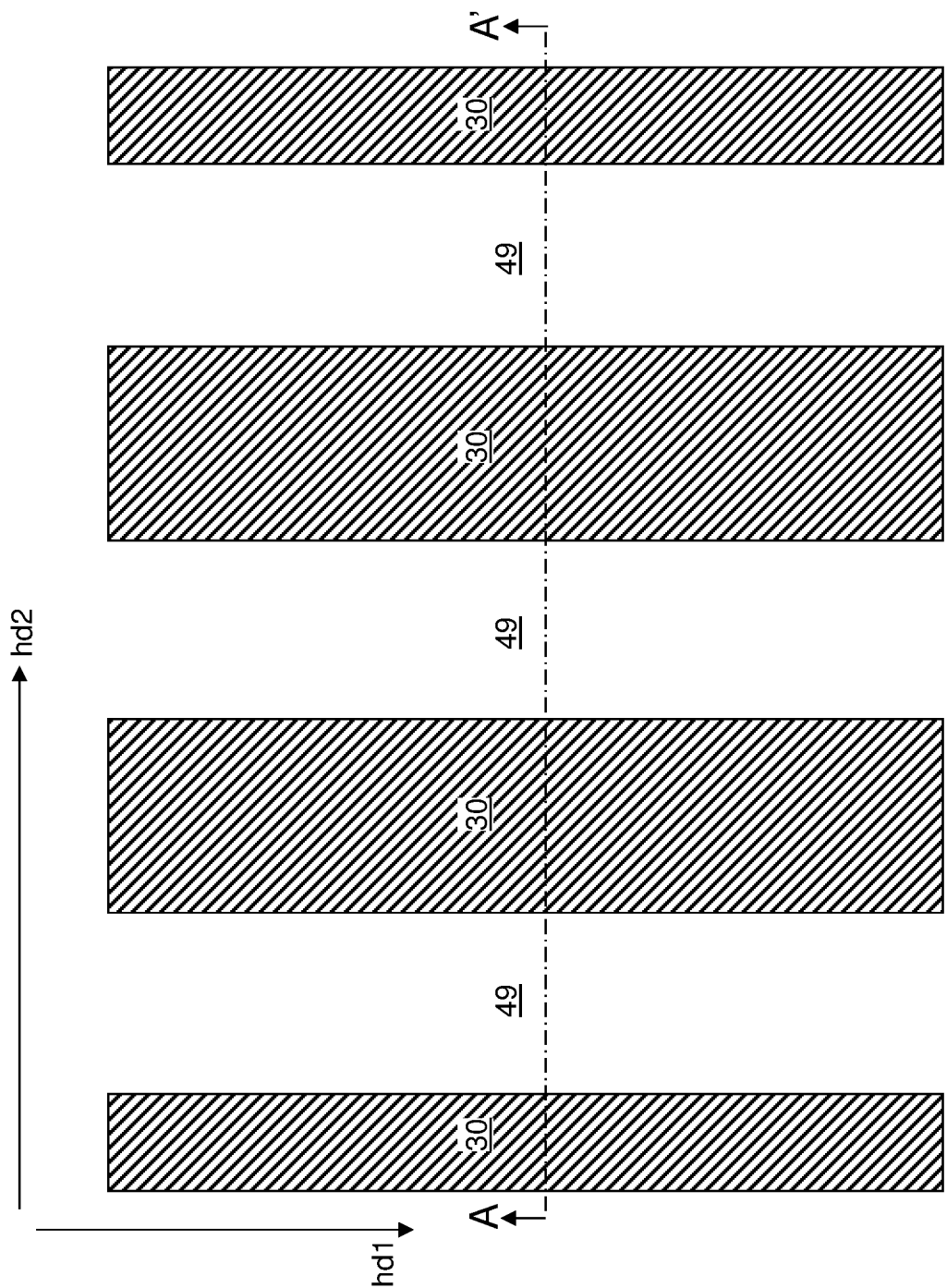
FIG. 3B is a horizontal cross-sectional view of the exemplary structure of FIG. 3A along the horizontal plane B-B'. The vertical plane A-A' is the plane of the cross-section for FIG. 3A.

Referring to FIGS. 3A and 3B, the top insulating layer 62, the alternating stack of electrically conductive layers 30 and dielectric material layers 61, and the bottom insulating layer 60 are patterned by forming line trenches 49 therethrough. Each line trench 49 laterally extends along the first horizontal direction hd1. Each line trench 49 can overlie the area of a respective composite rail structure (14B, 14C, 14T, 27). Top surfaces of the top active regions 14T within a composite rail structure (14T, 14C, 14B, 27) are physically exposed at the bottom of each line trench 49.

Each contiguous set of remaining portions of the electrically conductive layers 30 and the dielectric material layers 61 between a pair of line trenches 49 constitutes an alternating stack (30, 61) that is a rail structure. Each alternating stack (30, 61) overlies a respective access transistor level dielectric rail 42, extends along the first horizontal direction hd1, and is laterally spaced apart from other alternating stacks (30, 61) along the second horizontal direction hd2. Each patterned electrically conductive layer 30 can constitute a word line of a resistive random access memory device. In one embodiment, each alternating stack (30, 61) can have a lesser width along the second horizontal direction hd2 than the underlying access transistor level dielectric rail 42, and can be entirety within the area of the underlying access transistor level dielectric rail 42.

A pair of a conductive material layer 30 and a dielectric material layer 61 can constitute a unit of repetition in each alternating stack (30, 61) of electrically conductive layers 30 and dielectric material layers 61. The total number of repetitions can be in a range from 8 to 1,024, although lesser and greater number of repetitions can also be employed. Each alternating stack (30, 61) can have the same number of repetitions. Thus, a plurality of alternating stacks (30, 61) of dielectric material layers 61 and electrically conductive layers 30 is formed over a substrate 6. Each of the dielectric material layers 61 and the electrically conductive layers 30 extends along the first horizontal direction (i.e., the word line direction) hd1. The alternating stacks (30, 61) are laterally spaced from one another along the second horizontal direction hd2 (i.e., the global bit line direction) by line trenches 49 that extend along the first horizontal direction hd1. Each electrically conductive layer 30 within the alternating stacks (30, 61) is a word line for a three-dimensional memory structure, which can include a ReRAM device, to be subsequently formed. Thus, each alternating stack (30, 61) can include respective word lines (as embodied as the electrically conductive layers 30 as patterned by the line trenches 49) and respective dielectric material layers 61. Each of the word lines and the dielectric material layers 61 can have a strip shape, i.e., an elongated structure that extends along the first horizontal direction hd1 and having a uniform width throughout.

Figure 4A:
FIG. 4A is a vertical cross-sectional view of the exemplary structure after formation of sacrificial rail structures according to an embodiment of the present disclosure.
Figure 4B:
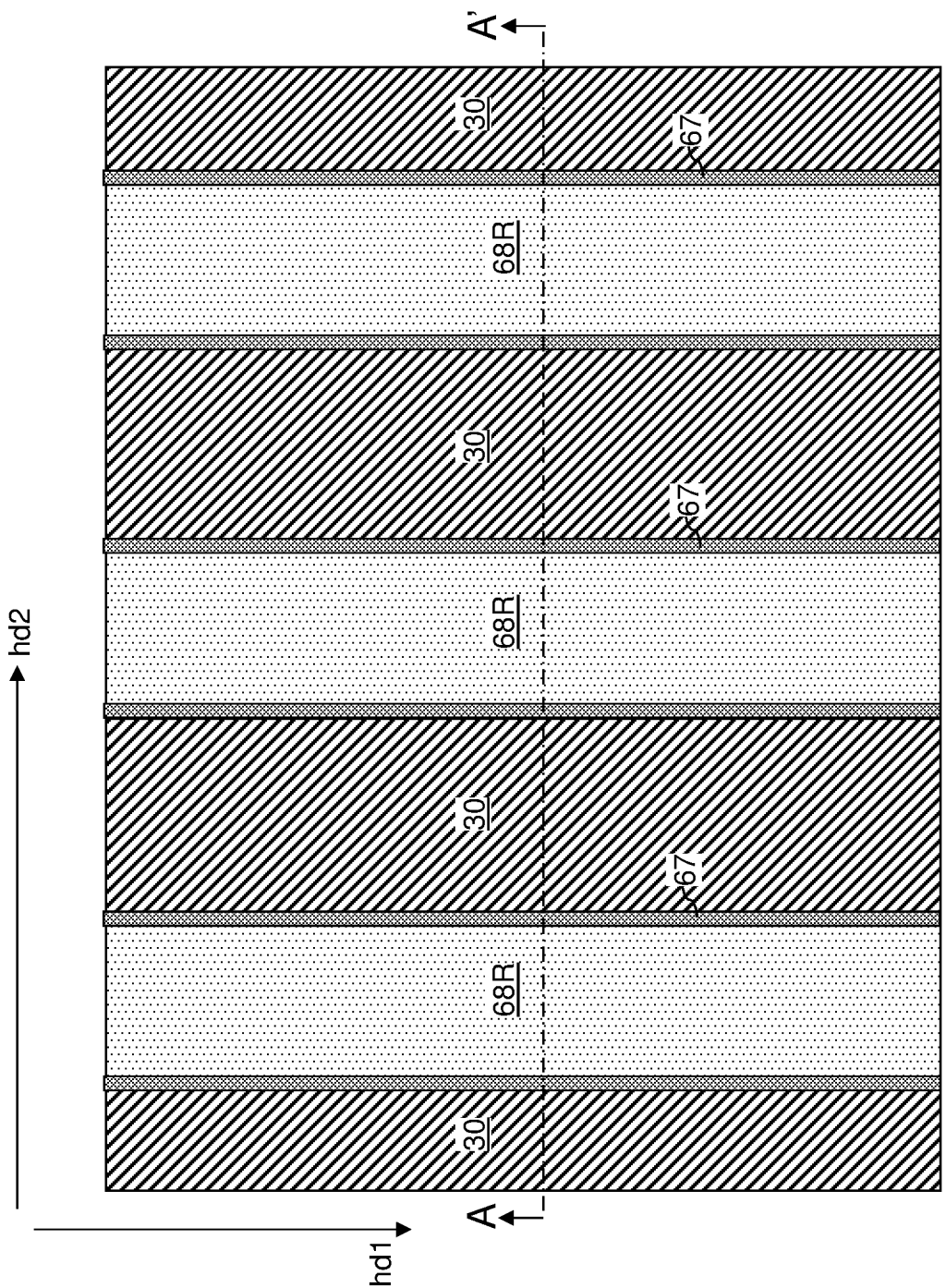
FIG. 4B is a horizontal cross-sectional view of the exemplary structure of FIG. 4A along the horizontal plane B-B'. The vertical plane A-A' is the plane of the cross-section for FIG. 4A.

Referring to FIGS. 4A and 4B, an etch stop liner layer 67 and a sacrificial fill material are sequentially deposited within each line trench 49. The etch stop liner layer 67 includes a sacrificial material that can function as an etch stop layer during subsequent removal of the sacrificial fill material. The sacrificial fill material includes a material that can be subsequently removed selective to the top insulating layer 62 and the etch stop liner layer 67. For example, the etch stop liner layer 67 can include silicon nitride that is deposited by chemical vapor deposition (CVD), and the sacrificial fill material can include any of the materials that can be employed for the dielectric material layers 61, e.g., a hydrogen-doped silicon oxide materials having an etch rate greater than 3 times (such as greater than 10 times and/or greater than 30 times) the etch rate of thermal silicon oxide upon exposure to diluted hydrofluoric acid. For example, the sacrificial fill material can include flowable silicon oxide material formed by flowable chemical vapor deposition (FCVD), such as by Eterna® flowable chemical vapor deposition (FCVD) system by Applied Materials, Inc., or silicon oxide material deposited by spin-on coating using a perhydropolysilazane inorganic spin-on dielectric (PSZ-SOD) source material.

The etch stop liner layer 67 can be deposited by a conformal deposition method such as low pressure chemical vapor deposition. The thickness of the etch stop liner layer 67 can be in a range from 2 nm to 40 nm, although lesser and greater thicknesses can also be employed. The sacrificial fill material can be deposited by a conformal deposition method, a non-conformal deposition method with at least one reflow process, or spin coating. Excess portions of the sacrificial fill material and the etch stop liner layer 67 formed above a horizontal plane including the top surface of the top insulating layer 62 can be removed by a planarization process such as chemical mechanical planarization or a recess etch. Each remaining portion of the sacrificial fill material in the line trenches 49 constitutes a sacrificial rail fill structure 68R. Each adjoining pair of an etch stop liner layer 67 and a sacrificial rail fill structure 68R within a line trench 49 constitutes a sacrificial rail structure (67, 68R). The alternating stacks (30, 61) and the sacrificial rail structures (67, 68R) can form a one-dimensional periodic array along the second horizontal direction hd2, which is an alternating sequence with a periodicity equal to the pitch for the alternating stacks (30, 61) as measured along the second horizontal direction hd2. Specifically, the alternating stacks (30, 61) and the sacrificial rail structures (67, 68R) can have a periodicity that is equal to the sum of the width of an alternating stack (30, 61) and the width of a sacrificial rail structure (67, 68R).

Figure 5A:
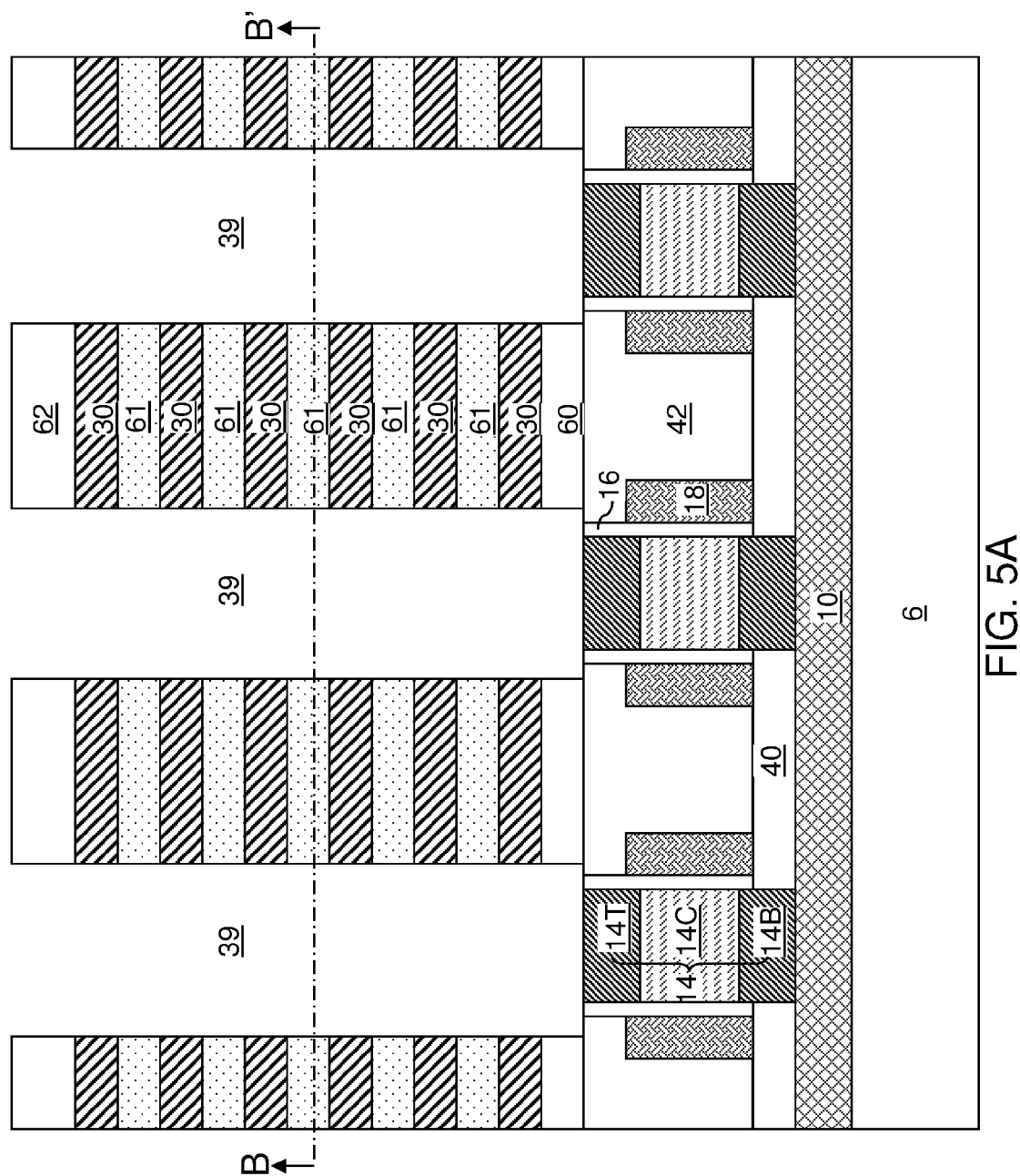
FIG. 5A is a vertical cross-sectional view of the exemplary structure after formation of an alternating array of bit line cavities and sacrificial pillars within each line trench by removing portions of the sacrificial rail structures according to an embodiment of the present disclosure.
Figure 5B:
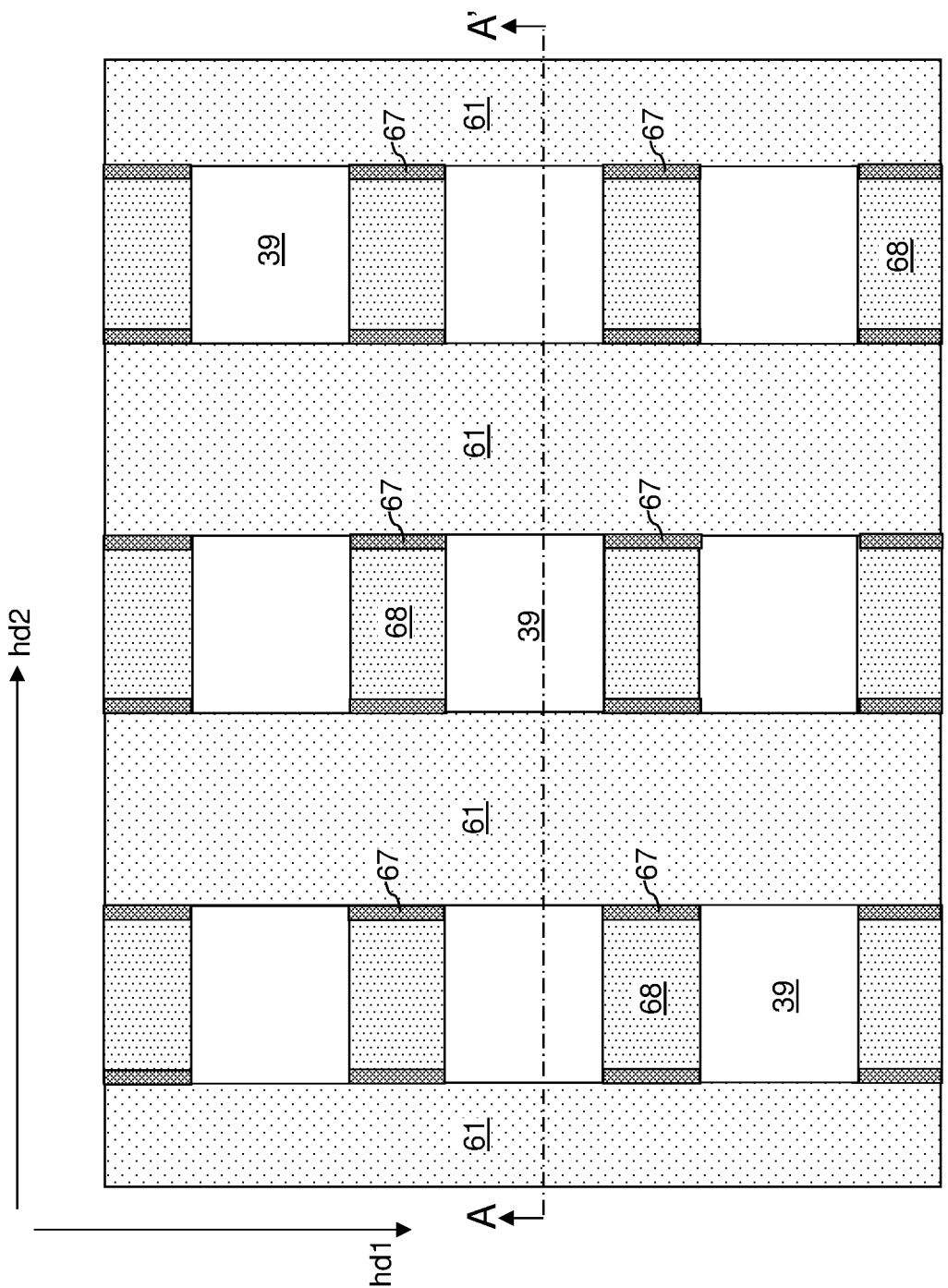
FIG. 5B is a horizontal cross-sectional view of the exemplary structure of FIG. 5A along the horizontal plane B-B'. The vertical plane A-A' is the plane of the cross-section for FIG. 5A.

Referring to FIGS. 5A and 5B, bit line cavities 39 can be formed by patterning the sacrificial rail structures (67, 68R) into sacrificial pillars (67, 68). Specifically, a photoresist layer (not shown) can be applied over the top insulating layers 62 and the sacrificial rail structures (67, 68R), and can be lithographically' patterned to form pillars that overlie areas of the separator dielectric material portions 12. For example, an anisotropic etch that removes the sacrificial rail fill structures 68R selective to the dielectric material of the top insulating layers 62 can be performed to remove portions of the sacrificial rail fill structure 68R that are not covered by a combination of the photoresist layer portions and top insulating layers 62. Subsequently, an isotropic etch can be performed to remove physically exposed portions of the etch stop liner layers 67. Each remaining portion of the sacrificial rail fill structures 68R is herein referred to as a sacrificial fill material portion 68. Each contiguous pair of a remaining etch stop liner layer 67 and a sacrificial fill material portion 68 constitutes a sacrificial pillar (67, 68).

Bit line cavities 39 having rectangular horizontal cross-sectional areas and extending through the alternating stacks (30, 61) to top surfaces of the top active regions 14T can be formed, thereby separating the sacrificial rail structures (67, 68R) into sacrificial pillars (67, 68). The bit line cavities 39 can form a two-dimensional rectangular array. The sacrificial pillars (67, 68) can form another two-dimensional rectangular array having the same periodicity as the two-dimensional rectangular array of the hit line cavities 39. Within each line trench 49, an alternating array of bit line cavities 39 and sacrificial pillars (67, 68) can be formed by removing the etched portions of the sacrificial rail structures (67, 68R), i.e., by formation of the bit line cavities 39.

While an embodiment in which the area of each bit line cavity 39 is greater than the area of an underlying top active region 14T, embodiments are expressly contemplated herein in which the area of each bit line cavity 39 is substantially the same as, or is less than, the area of an underlying top active region 14T. Further, the geometrical center of each bit line cavity 39 may be located on a vertical line passing through the geometrical center of an underlying vertical stack of a bottom active region 14B, a semiconductor channel 14C, and a top active region 14T, or may be laterally offset from the vertical line due to an overlay variation during the patterning processes employed to form pattern the alternating stacks (30, 61) and the sacrificial pillars (67, 68).

Figure 6A:
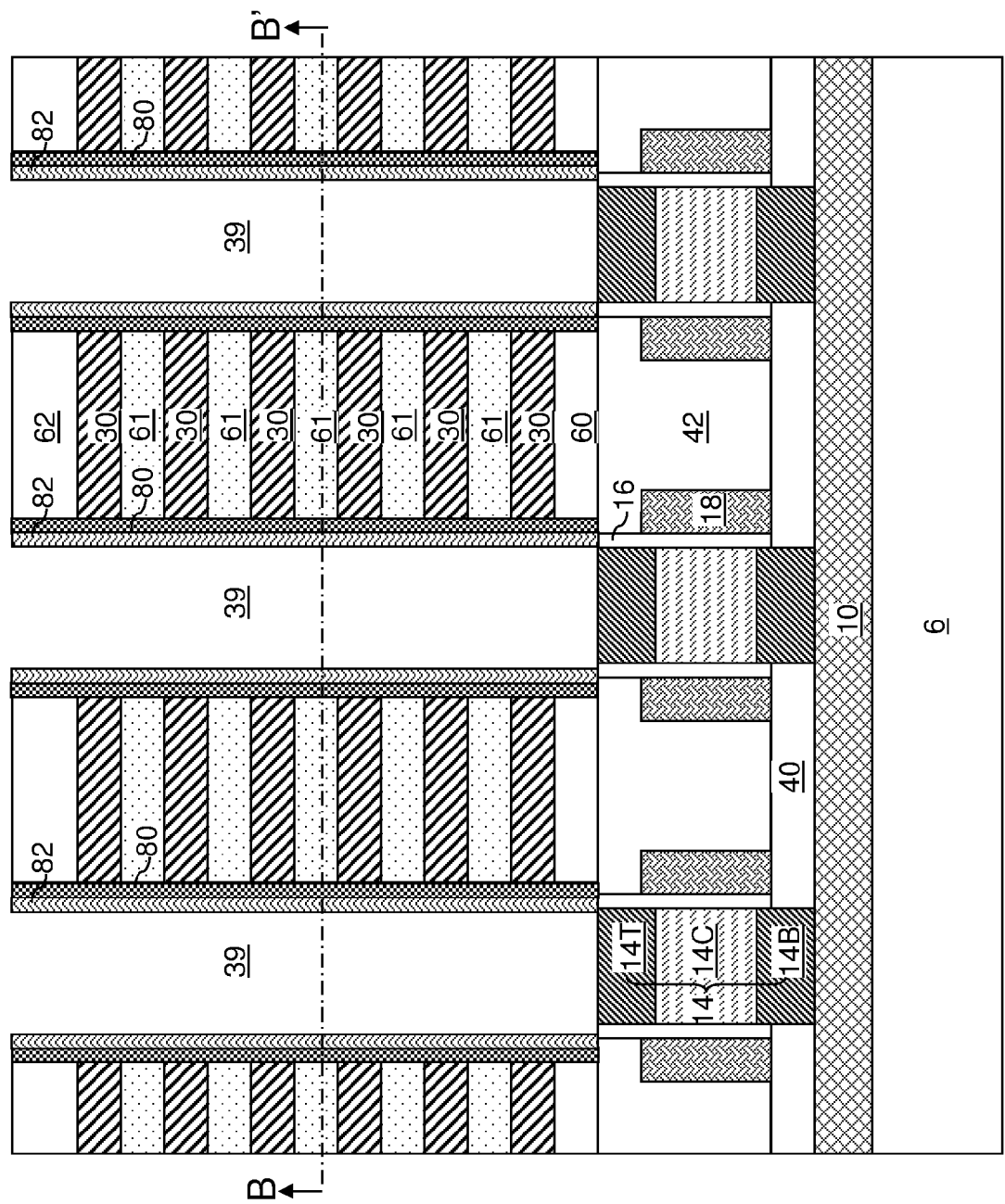
FIG. 6A is a vertical cross-sectional view of the exemplary structure after formation of resistive memory material layers according to an embodiment of the present disclosure.
Figure 6B:
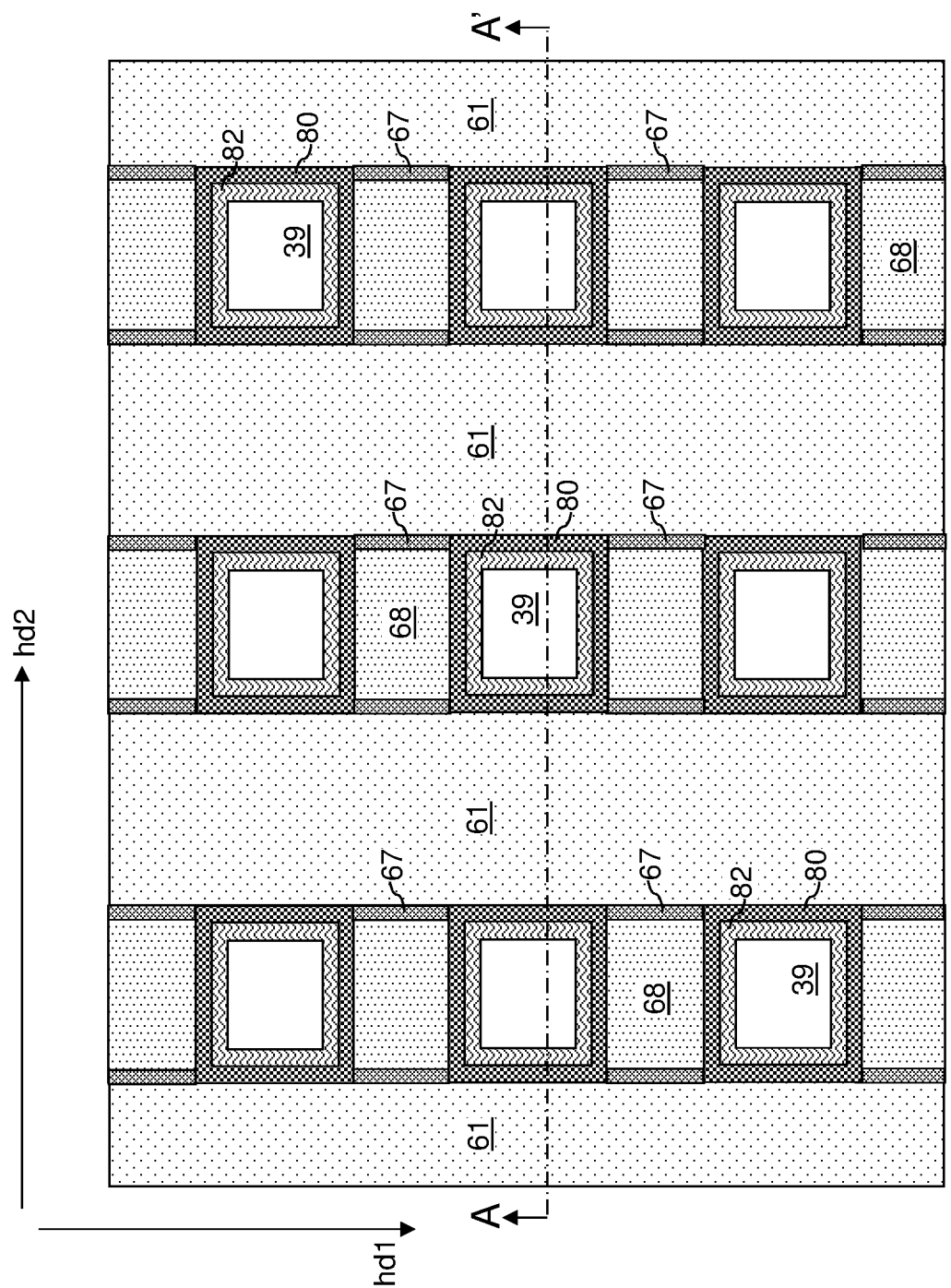
FIG. 6B is a horizontal cross-sectional view of the exemplary structure of FIG. 6A along the horizontal plane B-B'. The vertical plane A-A' is the plane of the cross-section for FIG. 6A.

Referring to FIGS. 6A and 6B, a resistive memory material layer 80 and an optional steering element layer 82 can be formed on each sidewall of the bit line cavities 39. For example, a continuous resistive memory material layer and a continuous steering element layer can be deposited as continuous layers, and can be anisotropically etched to remove horizontal portions thereof. Each remaining vertical portion of the continuous resistive memory material layer constitutes a resistive memory material layer 80, and each remaining vertical portion of the continuous steering element layer constitutes a steering element layer 82. Each resistive memory material layer 80 can be topologically homeomorphic to a torus, and each steering element layer 82 can be topologically homeomorphic to a torus. As used herein, an element is "topologically homeomorphic to a torus" if the element has a geometrical shape that can be continuously stretched to match a torus without creating or destroying a new hole.

Each resistive memory material layer 80 includes a layer or a layer stack that can provide regions of resistive memory elements. A "resistive memory element" refers to a resistive memory material portion provided in a configuration that can store information therein by the state of the resistive memory material therein. As used herein, "resistive memory material" or a "reversibly resistance-switching material" is a material of which the resistivity can be altered by application of an electrical bias voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance. The resistive memory material layer 80 may optionally include a tunneling dielectric. As used herein, a "tunneling dielectric" refers to a dielectric material portion in which the predominant mode of electrical current conduction therethrough is charge carrier tunneling such as electron tunneling or hole tunneling. As used herein, a tunneling dielectric layer refers to a layer including at least one tunneling dielectric.

As used herein, a "steering element" refers to an element, such as a diode, that provides a non-linear current-voltage characteristic for electrical current passing therethrough. In one embodiment, the steering element may have an asymmetric current-voltage characteristic (e.g., a diode which conducts current primarily in one direction (asymmetric conductance) and which has a lower resistance to the flow of current in one direction, and a higher resistance in the other direction). As used herein, a "steering element layer" refers to a layer including at least one steering element.

In some embodiments, each resistive memory element can include a barrier-modulated cell (BMC) containing a metal oxide material providing variable electrical resistivity depending on density of oxygen vacancies therein. An exemplary metal oxide material that provides variable electrical resistivity depending on density of vacancies includes titanium dioxide. The resistivity of titanium dioxide is low when the concentration of oxygen vacancies is high, and is high when the concentration of oxygen vacancies is low.

In some embodiments, each resistive memory element can include a filament-modulated cell containing a filament-forming dielectric oxide material that provides a reversible increase in electrical conductivity upon formation of conductive filaments therein. For example, a dielectric oxide material such as HfOx, ZrOx, WOx, NiOx, CoOx, CoAlOx, MnOx, $ZnMn_2O_4$, ZnOx, TaOx, NbOx, HfSiOx, or HfAlOx, where "x" indicates either a stoichiometric metal oxide (e.g., $HfO_2$) or a non-stoichiometric metal oxide (e.g., $HfO_{2-y}$).

In some embodiments, each resistive memory element can include a phase change material (PCM) cell containing a chalcogenide phase change material, such as a chalcogenide glass, for example $Ge_xSb_yTe_z$, where preferably x=2, y=2 and z=5, GeSb, AgInSbTe, GeTe, GaSb, BaSbTe, InSbTe and various other combinations of these basic elements. The materials that can be employed for the resistive memory material layers 80 depend on the nature of the resist resistive memory elements therein.

A tunneling dielectric layer, if employed as a sub-element within a resistive memory material layer 80, can include a dielectric material through which electron tunneling or hole tunneling can occur. In one embodiment, the tunneling dielectric layer includes a dielectric material having a dielectric constant of at least 7.0. For example, the tunneling dielectric layer can include a dielectric material selected from silicon nitride and aluminum oxide. In one embodiment, the thickness of the tunneling dielectric layer can be in a range from 0.6 nm to 4 nm (such as from 1.0 nm to 3 nm), although lesser and greater thicknesses can also be employed.

The steering element layer 82 is optional. Thus, depending on the configuration of specific resistive random access memory, the steering element layer 82 may, or may not, be present. Generally speaking, steering elements known in the art can be optionally employed in conjunction with the resistive memory material layers 80 of the present disclosure.

The steering element layers 82, if employed, can include at least one semiconductor element that provides a non-linear current-voltage characteristic. For example, the steering element layer can include at least one diode therein. In one embodiment, each diode can include a heavily doped n-doped semiconductor region (i.e., n+ region) having n-type dopants and a heavily doped p-doped semiconductor region (i.e., p+ region) at an atomic concentration greater than $5.0\times10^{19}/cm^3$. Alternatively, each diode can include a lightly or lighter doped p-doped semiconductor region (i.e., p− or p region) including p-type dopants at an atomic concentration less than $5.0\times10^{19}/cm^3$, in addition to or instead of the p+ region.

Each of the resistive memory material layers 80 and the steering element layers 82 can have a respective uniform thickness. The resistive memory material layers 80 can have a thickness in a range from 3 nm to 50 nm, although lesser and greater thicknesses can also be employed. In one embodiment, each of the resistive memory material layers 80 can have four substantially vertical outer sidewalls that are adjoined among one another at four substantially vertical outer edges, and four substantially vertical inner sidewalls that are adjoined among one another at four substantially vertical inner edges. The steering elements layers 82 can have a thickness in a range from 3 nm to 50 nm, although lesser and greater thicknesses can also be employed. In one embodiment, each of the steering elements layers 82 can have four substantially vertical outer sidewalls that are adjoined among one another at four substantially vertical outer edges, and four substantially vertical inner sidewalls that are adjoined among one another at four substantially vertical inner edges. In one embodiment, each of the sidewalls of the resistive memory material layers 80 and the steering elements layer 82 can be planar, i.e., within a respective two-dimensional plane.

While the present disclosure is described employing an embodiment in which the materials of the resistive memory material layers 80 are deposited first, and the materials of the steering element layers 82 are subsequently deposited, embodiments are expressly contemplated herein in which the order of deposition of the materials is reversed. In this case, outer sidewalls of the steering element layers 82 can contact sidewalls of the alternating stacks (30, 61) and sidewalls of the sacrificial pillars (67, 68), and inner sidewalls of the steering element layers 82 can contact outer sidewalls of the resistive memory material layers 80.

Figure 7A:
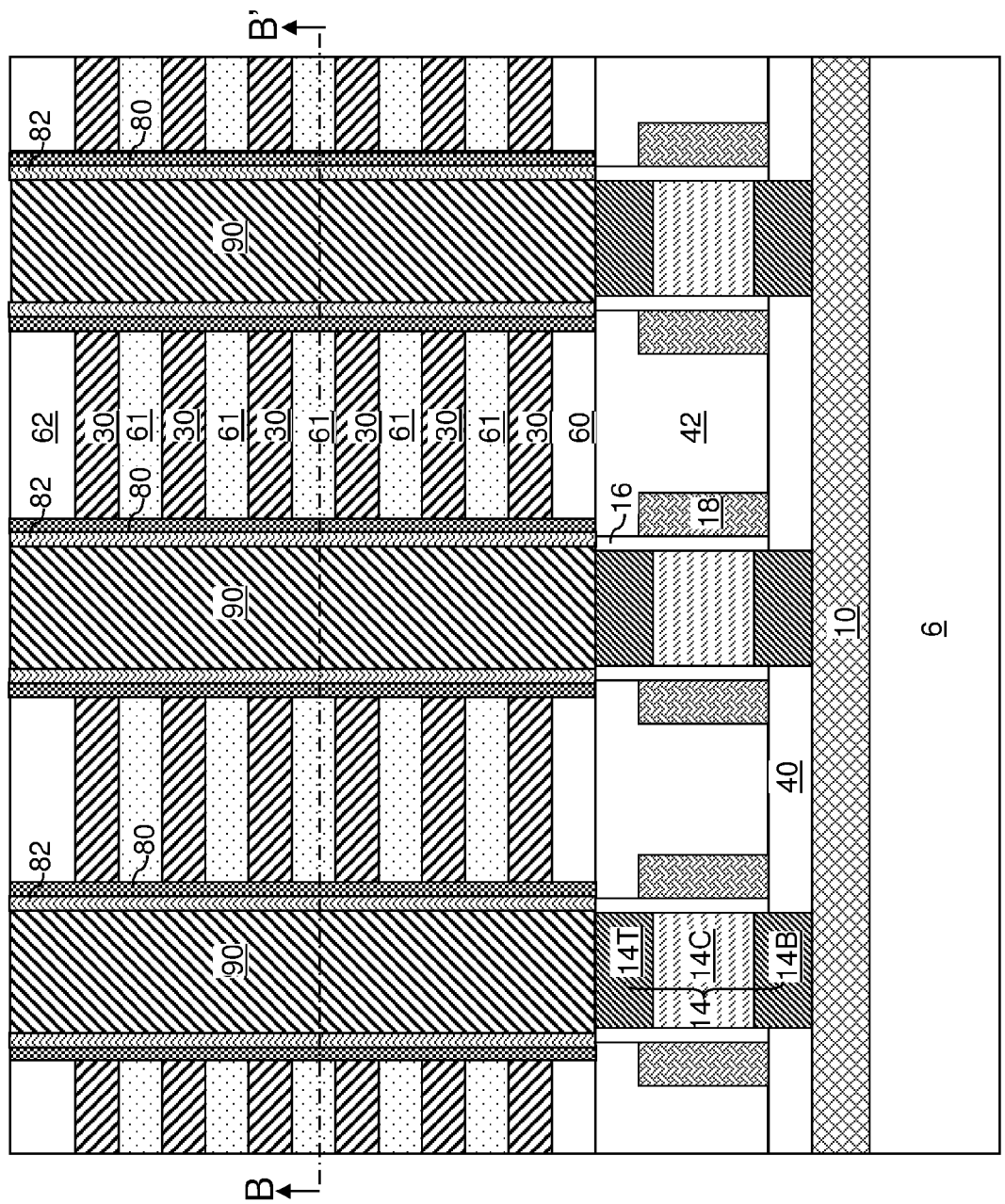
FIG. 7A is a vertical cross-sectional view of the exemplary structure after formation of vertical bit lines according to an embodiment of the present disclosure.
Figure 7B:
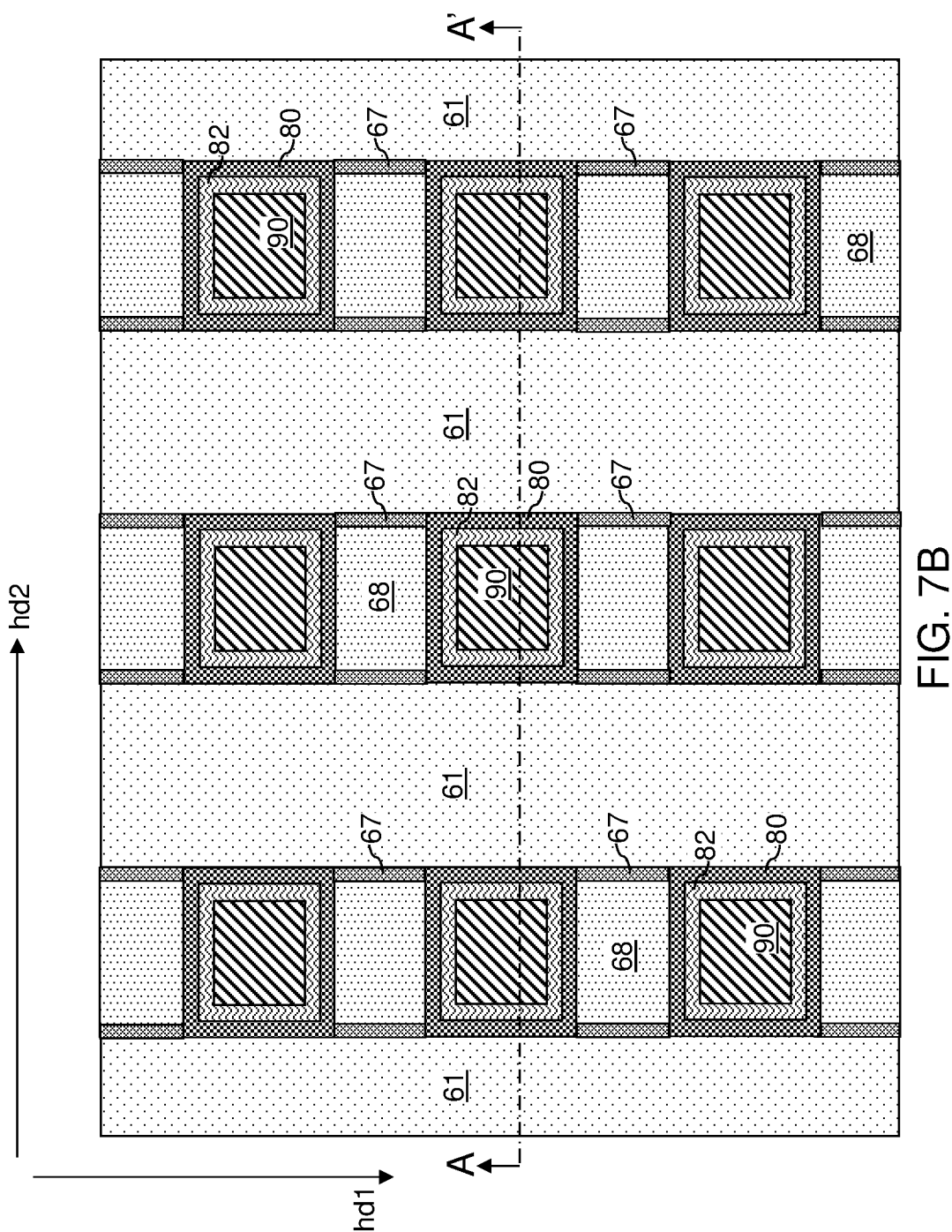
FIG. 7B is a horizontal cross-sectional view of the exemplary structure of FIG. 7A along the horizontal plane B-B'. The vertical plane A-A' is the plane of the cross-section for FIG. 7A.

Referring to FIGS. 7A and 7B, at least one conductive material is deposited in each remaining volume of the bit line cavities 39 to form vertical bit lines 90. The at least one conductive material can include an elemental metal, an intermetallic alloy, a conductive doped semiconductor material, and/or a conductive compound including at least one metal and at least one non-metal element such as a conductive metal nitride (e.g., TiN). In one embodiment, the at least one conductive material can be a heavily doped semiconductor material (e.g., polysilicon) having a doping of the same conductivity type as the top active regions 14T. In another embodiment, the at least one conductive material can include a combination of a metallic liner (such as a TiN liner) and a metallic fill material (such as Ti, W, or Cu). Excess portions of the at least one conductive material can be removed from above the top surface of the top insulating layers 62, for example, by a planarization process (such as chemical mechanical planarization and/or a recess etch).

Figure 8A:
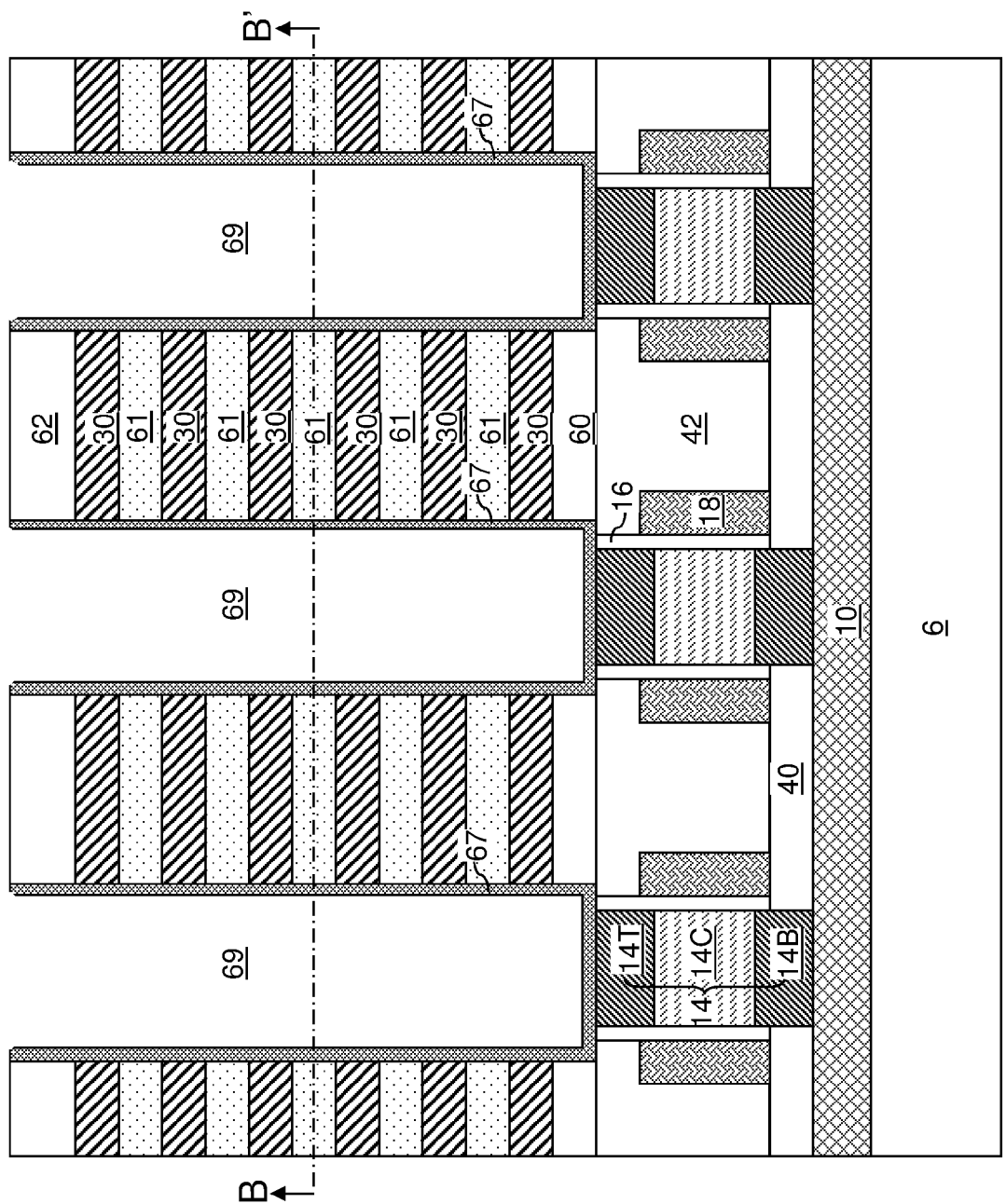
FIG. 8A is a vertical cross-sectional view of the exemplary structure after removal of sacrificial pillar fill portions within each of the line trenches according to an embodiment of the present disclosure.
Figure 8B:
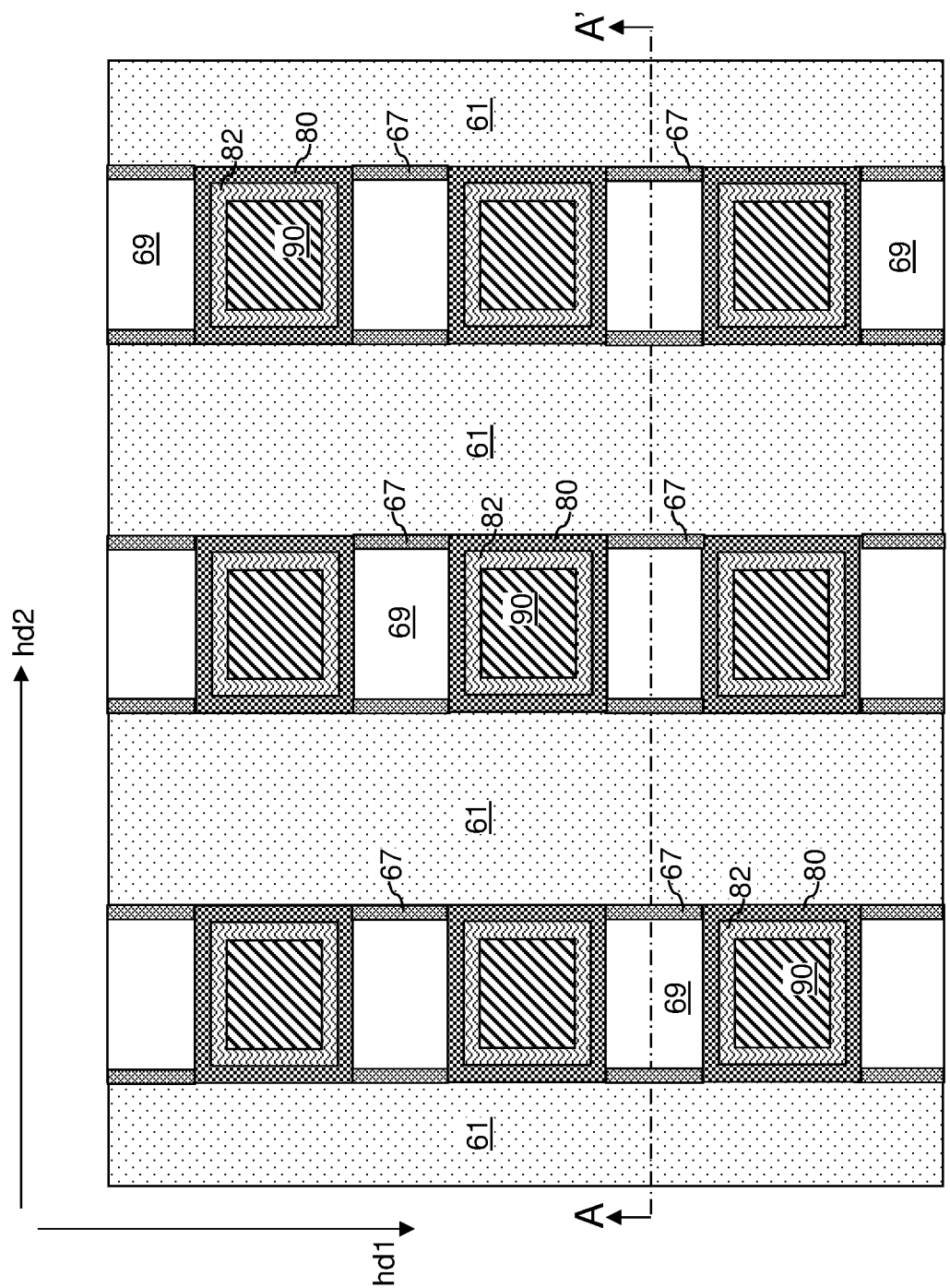
FIG. 8B is a horizontal cross-sectional view of the exemplary structure of FIG. 8A along the horizontal plane B-B'. The vertical plane A-A' is the plane of the cross-section for FIG. 8A.

Referring to FIGS. 8A and 8B, the sacrificial fill material portions 68 can be removed selective (e.g., by a selective wet etch) to the vertical bit lines 90, the resistive memory material layers 80, the steering element layers 82, the etch stop liner layers 67, and the top insulting layer 62. For example, if the etch stop liner layers 67 include silicon nitride and if the sacrificial fill material portions 68 include a hydrogen-doped silicon oxide material, a wet etch employing hydrofluoric acid can be performed to remove the material of the sacrificial fill material portions 68 selective to the etch stop liner layers 67. Inter-bit-line cavities 69 can be formed between each neighboring pair of vertical bit lines 90 that are laterally spaced apart along the first horizontal direction hd1. Each inter-bit-line cavity 69 can be laterally bounded by sidewalls of a pair of etch stop liner layers 67 and sidewalls of a pair of resistive memory material layers 80 or a pair of steering element layers 82.

Figure 9A:
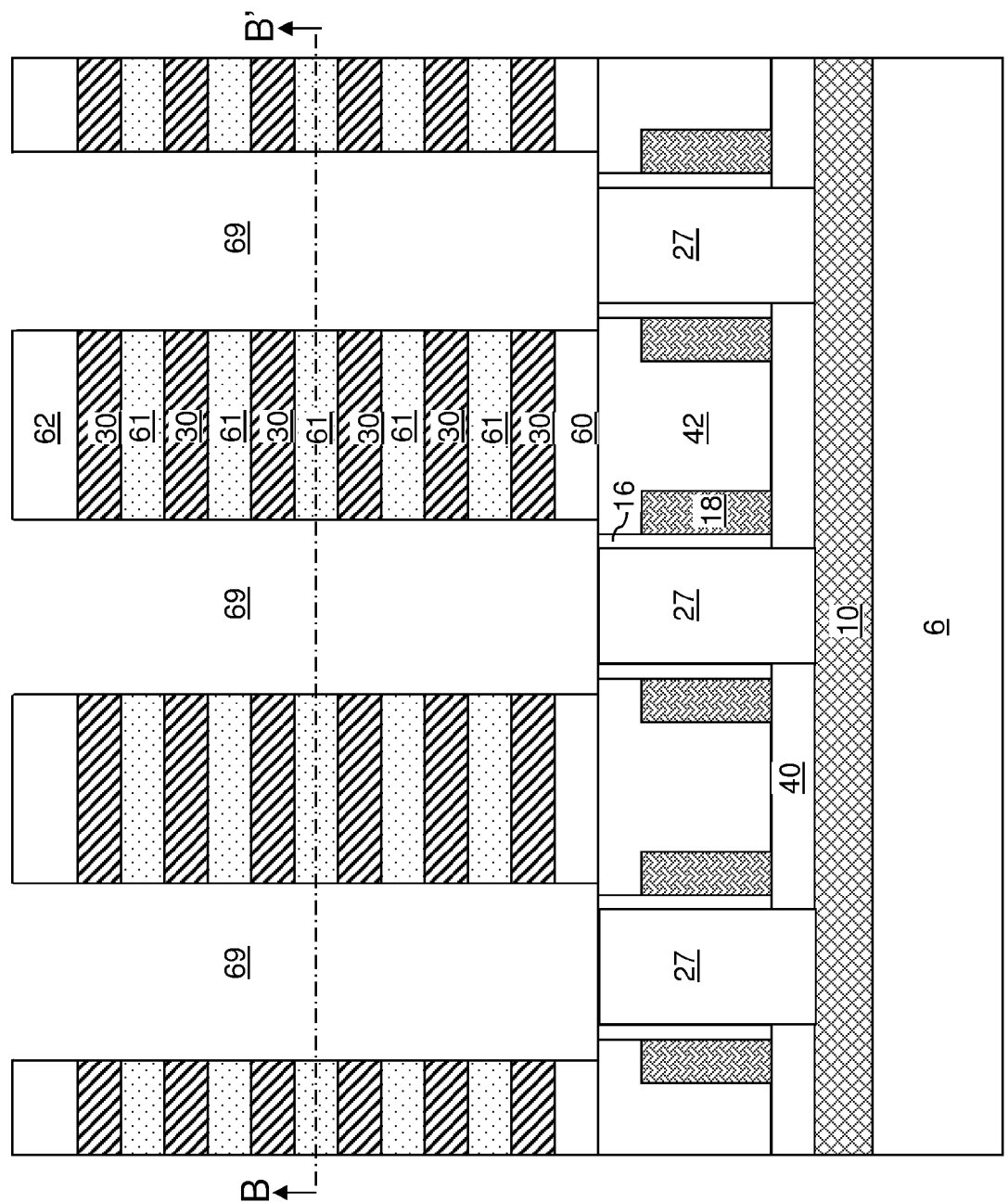
FIG. 9A is a vertical cross-sectional view of the exemplary structure after formation of an alternating sequence of vertical bit lines and inter-bit-line cavities within each of the line trenches according to an embodiment of the present disclosure.
Figure 9B:
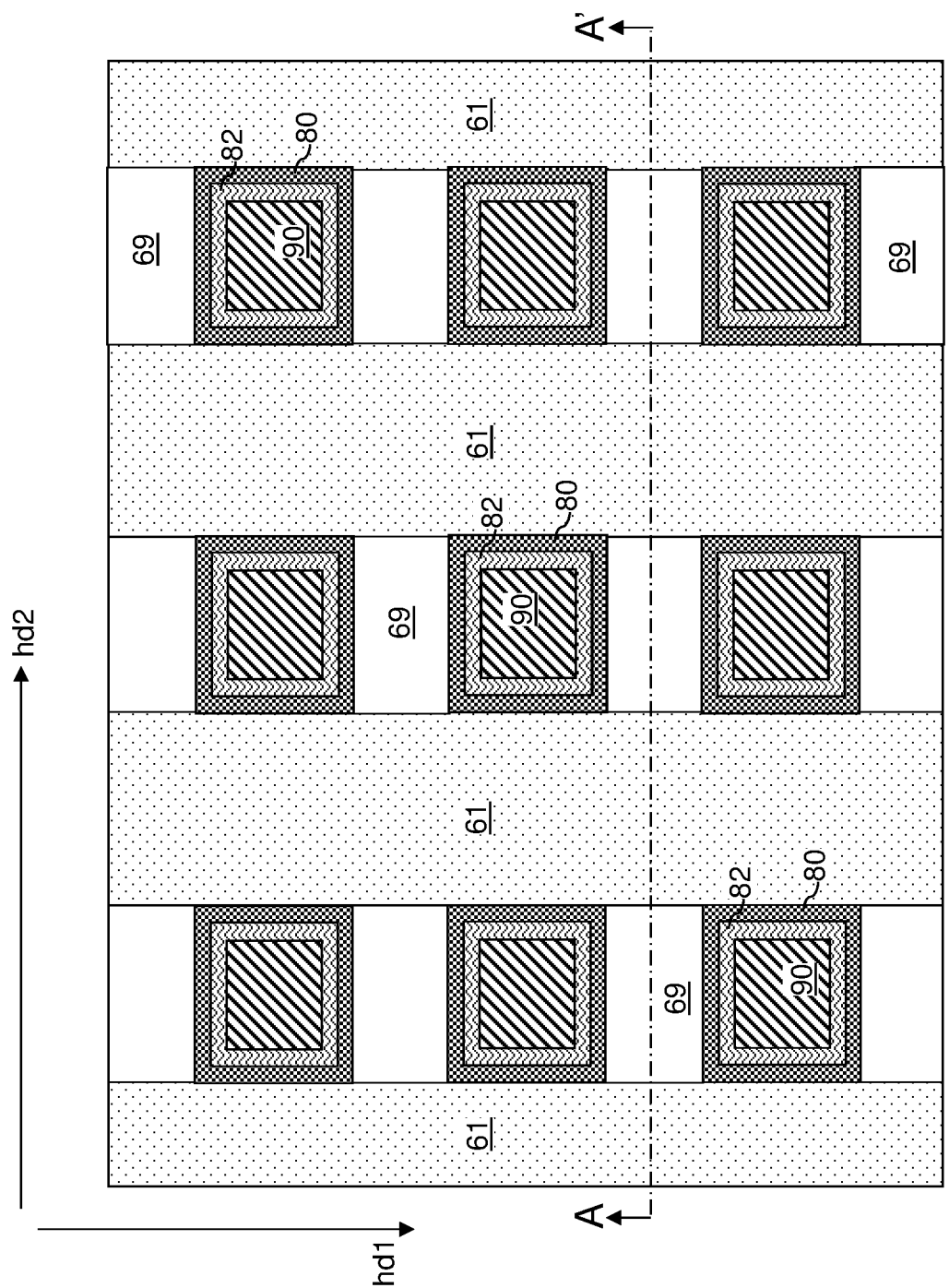
FIG. 9B is a horizontal cross-sectional view of the exemplary structure of FIG. 9A along the horizontal plane B-B'. The vertical plane A-A' is the plane of the cross-section for FIG. 9A.

Referring to FIGS. 9A and 9B, the etch stop liner layers 67 can be removed selective to the electrically conductive layers 30, the dielectric material layers 61, the top insulating layer 62, the bottom insulating layer 60, and the dielectric pillar structures 27 that underlie the inter-bit-line cavities 69. For example, if the etch stop liner layer 67 includes silicon nitride and if the dielectric material layers 61, the top insulating layer 62, the bottom insulating layer 60, and the dielectric pillar structures 27 include one type or several different types silicon oxide materials, the etch stop liner layer 67 can be removed selective to the dielectric material layers 61, the top insulating layer 62, the bottom insulating layer 60, and the dielectric pillar structures 27 by a selective wet etch, a vapor phase clean (VPC) using HF in a vapor phase or a chemical dry etch (CDE). For example, the selective wet etch can use hot phosphoric acid or other etch chemistries (e.g., dilute HF liquid solution having a 1 to at least 500 HF concentration ratio) that removes silicon nitride selective to silicon oxide materials. Upon removal of the etch stop liner layers 67, each inter-bit-line cavity 69 can be laterally bounded by sidewalls of a pair of alternating stacks (30, 61) and sidewalls of a pair of resistive memory material layers 80 or a pair of steering element layers 82. Each inter-bit-line cavity 69 is formed by removal of a corresponding sacrificial pillar (67, 68), and can have the same volume as the volume of the corresponding sacrificial pillar (67, 68).

An alternating sequence of vertical bit lines 90 and inter-bit-line cavities 69 is formed within each of the line trenches 49. Resistive memory material layers 80 including resistive memory elements are provided at intersection regions between the word lines (which comprise electrically conductive layers 30) and the vertical bit lines 90. As used herein, an "intersecting region" refers to a region at, or near, where two elements that extend along different directions have the minimum separation distance. Specifically, portions of the resistive memory material layers 80 located adjacent to the word lines constitute resistive memory elements that can store information by the resistive state of the respective memory material portion. The vertical bit lines 90 in the line trenches 49 can collectively form a two-dimensional array of vertical bit lines 90.

Figure 10A:
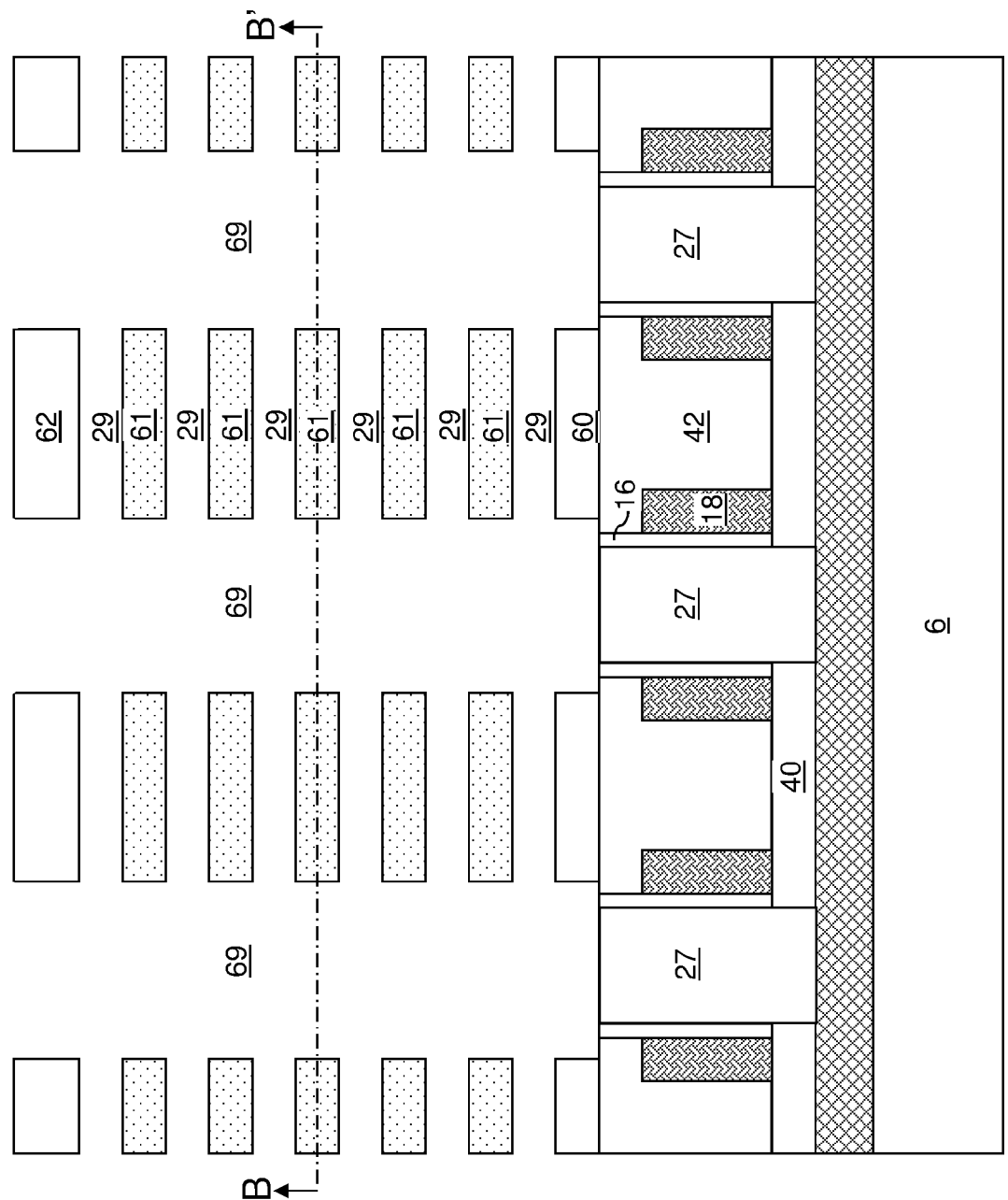
FIG. 10A is a vertical cross-sectional view of the exemplary structure after removal of portions of the dielectric material layers and formation of air gaps according to an embodiment of the present disclosure.
Figure 10B:
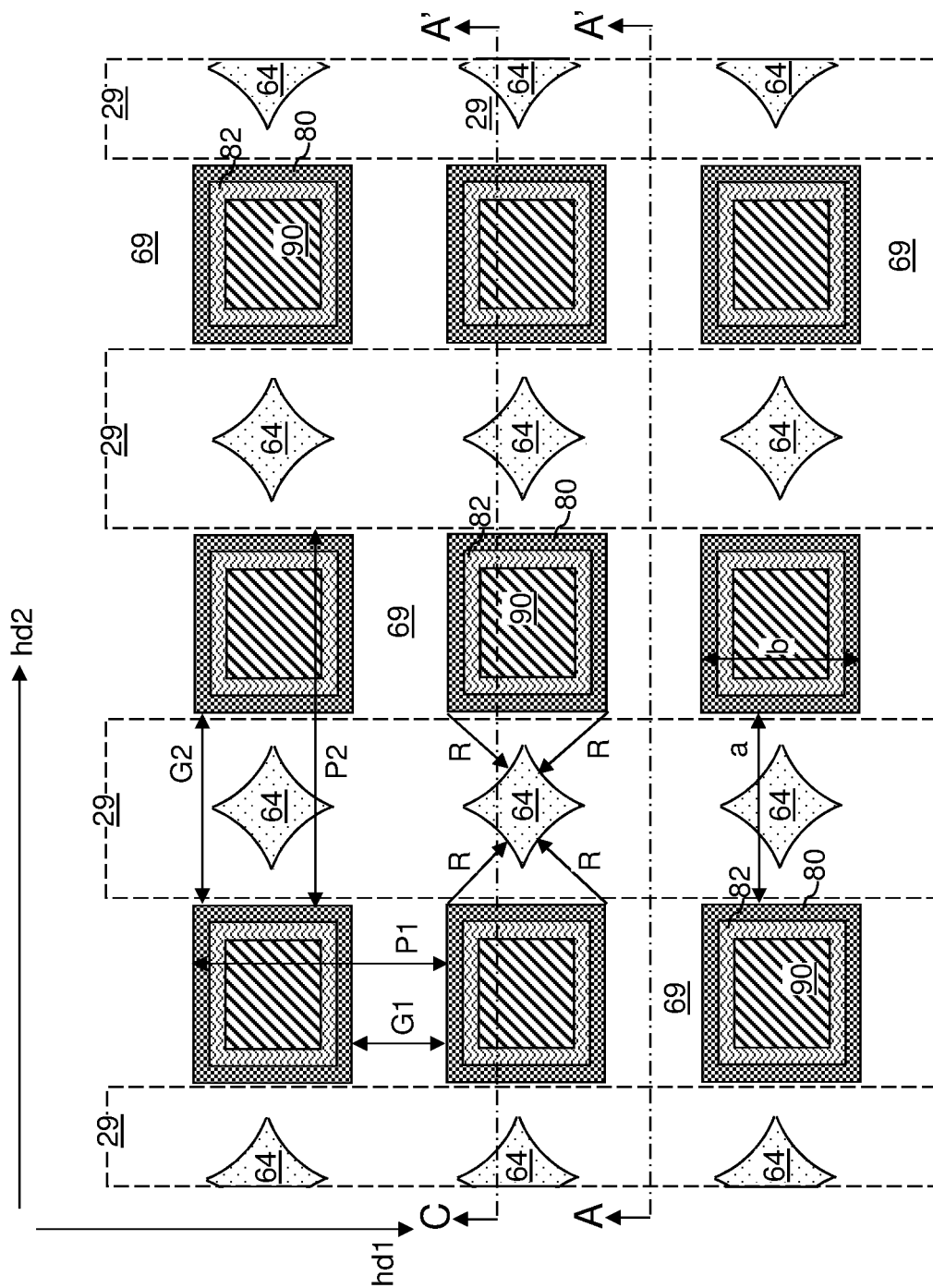
FIG. 10B is a horizontal cross-sectional view of the exemplary structure of FIG. 10A along the horizontal plane B-B'. The vertical plane A-A' is the plane of the cross-section for FIG. 10A.
Figure 10C:
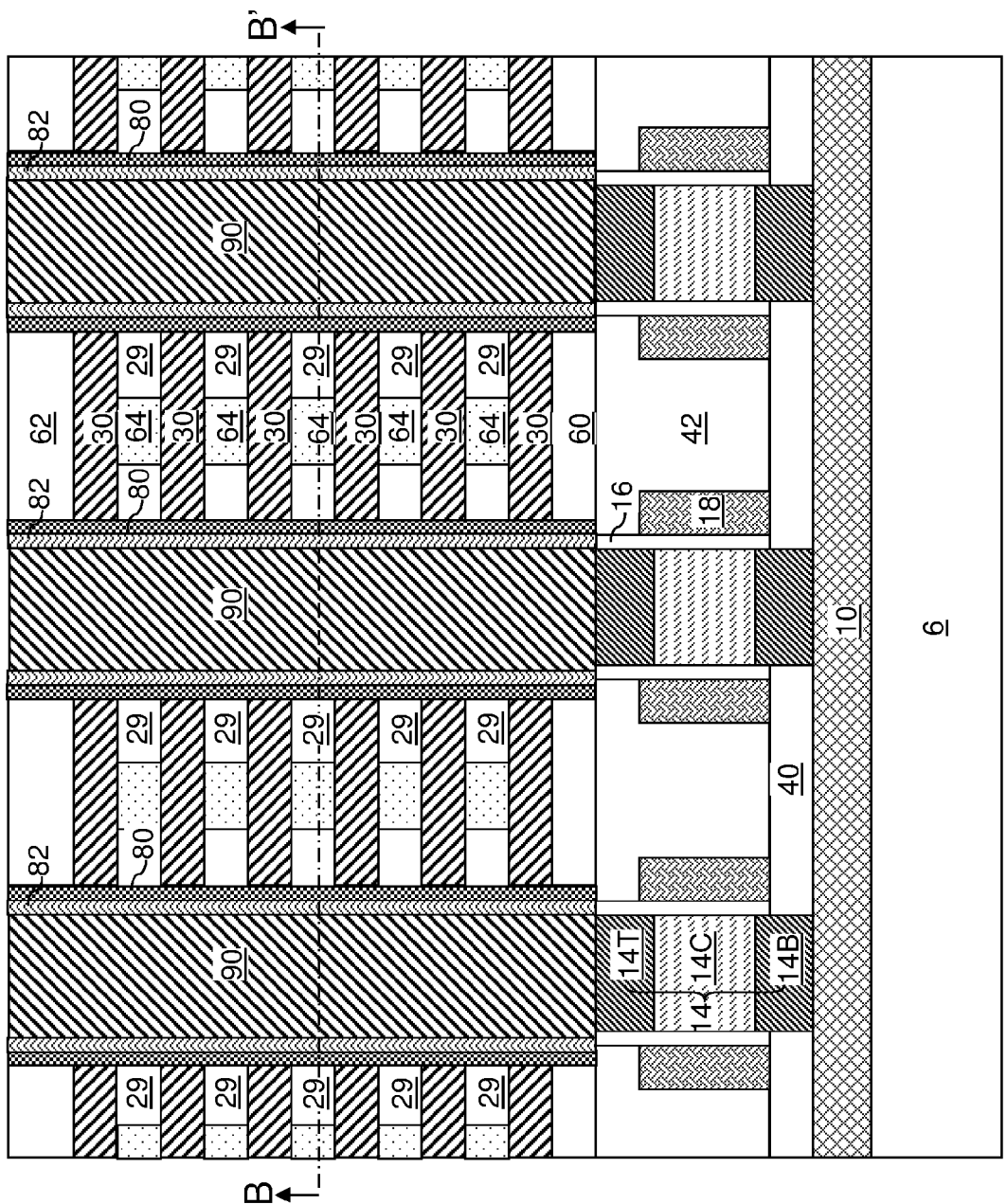
FIG. 10C is a vertical cross-sectional view of the exemplary structure of FIGS. 10A and 10B along the vertical plane C-C' in FIG. 10B.

Referring to FIGS. 10A-10C, an isotropic etch can be performed to laterally recess the dielectric material layers 61 selective to the electrically conductive layers 30 and the resistive memory material layers 80. The isotropic etch can be performed by an etchant that is provided into the inter-bit-line cavities 69 in a gas phase (if a dry etch is employed) or in a liquid phase (if a wet etch process is employed). The isotropic etch can we performed using liquid phase HF, a vapor phase clean (VPC) using HF in a vapor phase, or CDE. The removal of the dielectric material layers 61 can be selective to the top insulating layer 62 and the bottom insulating layer 60 if layers 60 and 62 are different from layers 61. For example, if the dielectric material layers 61 include a hydrogen-doped silicon oxide material, the isotropic etch process can employ hydrofluoric acid in a liquid phase (e.g., dilute hydrofluoric acid) or in a gas phase (e.g., VPC). Alternatively, if layers 60 and 62 are the same as layers 61, then layers 60 and 62 can be etched together with layers 61.

Removal of the material of the dielectric material layers 61 by the etchant forms a void that can extend along the first horizontal direction hd1 at each level between a vertically neighboring pair of electrically conductive layers 30. Each continuous void that laterally extends along the first horizontal direction hd1 between a neighboring pair of rows of vertical bit lines 90 is herein referred to as an air gap 29. As used herein, an "air gap" refers to any region between adjacent layers that does not include materials in a solid phase, a liquid phase, or a plasma phase. In other words, an "air gap" refers to any region that includes only a gas phase material or includes only vacuum therein. In case a wet etch is employed to etch the material of the dielectric material layers 61, air gaps 29 are formed upon removal of the liquid etchant. If a dry etch is employed to etch the material of dielectric material layers 61, air gaps 29 are formed upon termination of application of plasma.

The air gaps 29 can be formed by removing all of or a predominant portion of each of the dielectric material layers 61 selective to the word lines (as embodied as the electrically conductive layers 30), the vertical bit lines 90, and the resistive memory material layers 80. As used herein, a predominant portion refers to a portion that includes more than 50% of all atoms within the entirety. An alternating stack (30, 29) of electrically conductive layers 30 and air gaps 29 replaces a respective alternating stack (30, 61) of electrically conductive layers 30 and dielectric material layers 61. Thus, a plurality of alternating stacks (30, 29) of word lines and the air gaps 29 is formed, where the air gaps have a shape of the dielectric material layers.

In one embodiment, all of the dielectric material layers 61 can be completely removed. In another embodiment, removal of the dielectric material layers 61 can be partial. In other words, residual portions of the dielectric material layers 61 can remain after termination of the etch process that removes a predominant portion of the dielectric material layers 61. Each optional remaining portion of the dielectric material layers 61 constitutes an optional dielectric pillar 64, as shown in FIGS. 10B and 10C. In one embodiment, a two-dimensional array of dielectric pillars 64 having the same two-dimensional periodicity as the two-dimensional array of vertical bit lines 90 can be formed. In this case, the two-dimensional array of dielectric pillars 64 can be formed by an isotropic etch of the dielectric material layer 61 by an etchant that is provided through the inter-bit-line cavities 69.

As shown in FIG. 10B, in one embodiment, the isotropic etch can be timed such that the maximum etch distance R as measured from surfaces of the dielectric material layers 61 that are physically exposed to the inter-bit-line cavities 69 prior to the isotropic etch can be greater than one half of width "a" of the dielectric material layers 61 (measured along the second horizontal direction hd2, which is perpendicular to the first horizontal direction hd1). If outer sidewalls of each resistive memory material layer 80 that are parallel to the second horizontal direction hd2 are laterally spaced apart by width "b" along the first horizontal direction hd1, the maximum etch distance R can be less than one half of the square root of the sum of the square of the width a of the dielectric material layer 61 and the square of the width b along the first horizontal direction hd1. Thus, the magnitude of R can be given by:

$$\frac{a}{2} < R < \frac{\sqrt{a^2+b^2}}{2}.$$

In one embodiment, each surface of the dielectric pillars 64 can be equidistant from the most proximal outer edge of the resistive memory material layers 80. In this case, surfaces of the dielectric pillars 64 can be concave and vertical. Specifically, the sidewalls of the dielectric pillars 64 can have concavity with radius of curvature that is the same as the maximum, etch distance R in a horizontal cross-sectional view, and the shape of the sidewalls of the dielectric pillars 64 can be invariant under vertical translation. In one embodiment, each of the plurality of dielectric pillars 64 comprises a respective set of vertical concave sidewalls that are adjoined to one another.

In one embodiment, each air gap 29 can laterally extend along the first horizontal direction hd1, and can laterally enclose a respective subset of the plurality of dielectric pillars 64 that are laterally spaced apart from one another along the first horizontal direction hd1. In one embodiment, each air gap 29 can laterally enclose an entire set of dielectric pillars 64 located between a neighboring pair of rows of vertical bit lines 90 arranged along the first horizontal direction hd1. As used herein, a first structure "laterally encloses" a second structure if the first structure surrounds the entirety of the second structure between the topmost surface of the second structure and the bottommost surface of the second structure.

In one embodiment, the two-dimensional array of vertical bit lines 90 can comprise a rectangular array of vertical bit lines 90. The two-dimensional array of dielectric pillars 64 can comprise a rectangular array of dielectric pillars 64 having a same two-dimensional periodicity as the rectangular array of vertical bit lines 90. Each of the discrete dielectric pillars 64 can include four vertical concave sidewalls that are adjoined to one another by vertical edges. Each sidewall of a dielectric pillar 64 may be rotated by about 45 degrees from the two nearest sidewalls of two adjacent vertical bit lines 90, as shown in FIG. 10B.

Figure 11A:
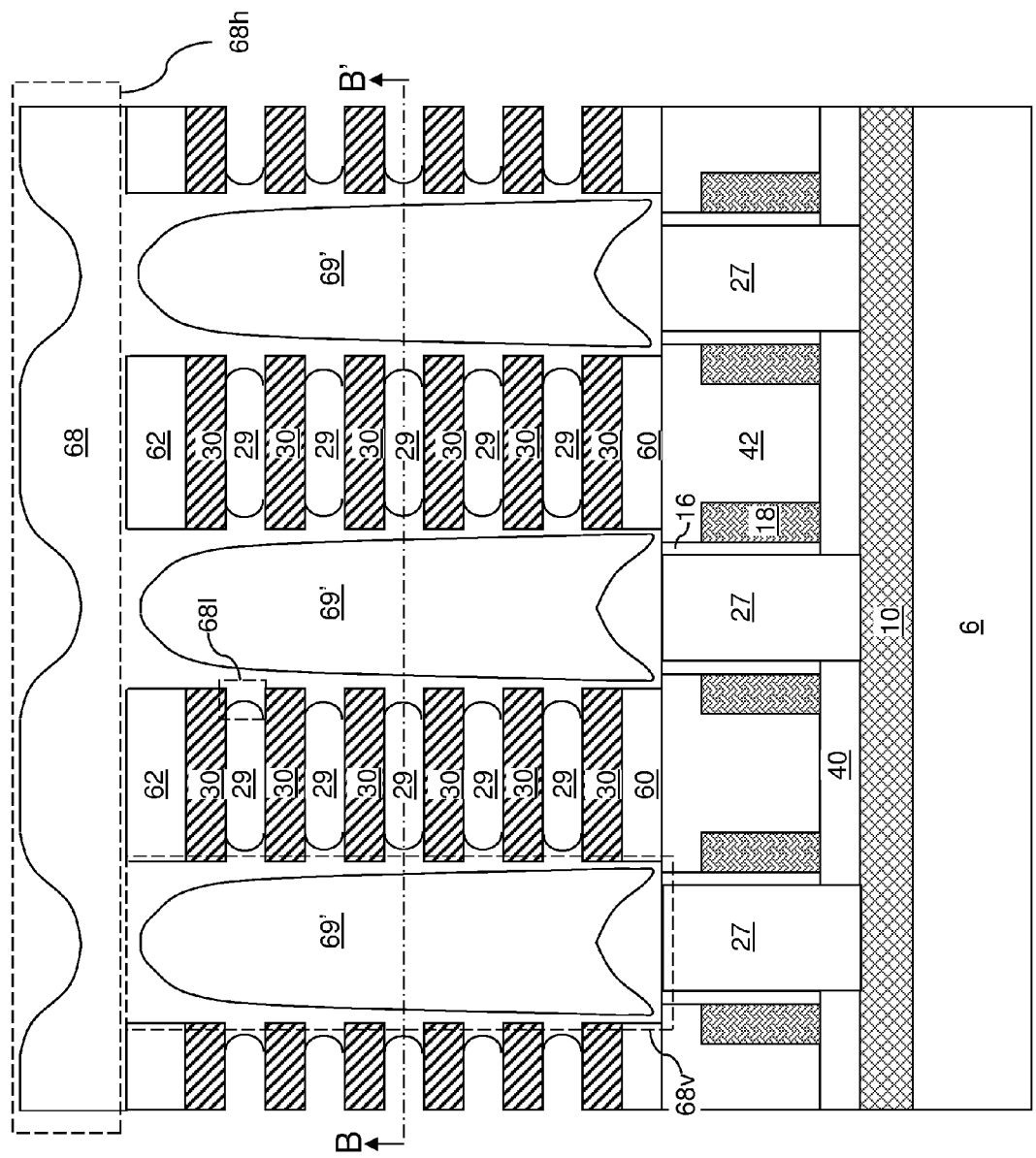
FIG. 11A is a vertical cross-sectional view of the exemplary structure after forming a dielectric isolation layer over the alternating stacks and in the inter-bit-line cavities according to an embodiment of the present disclosure.
Figure 11B:
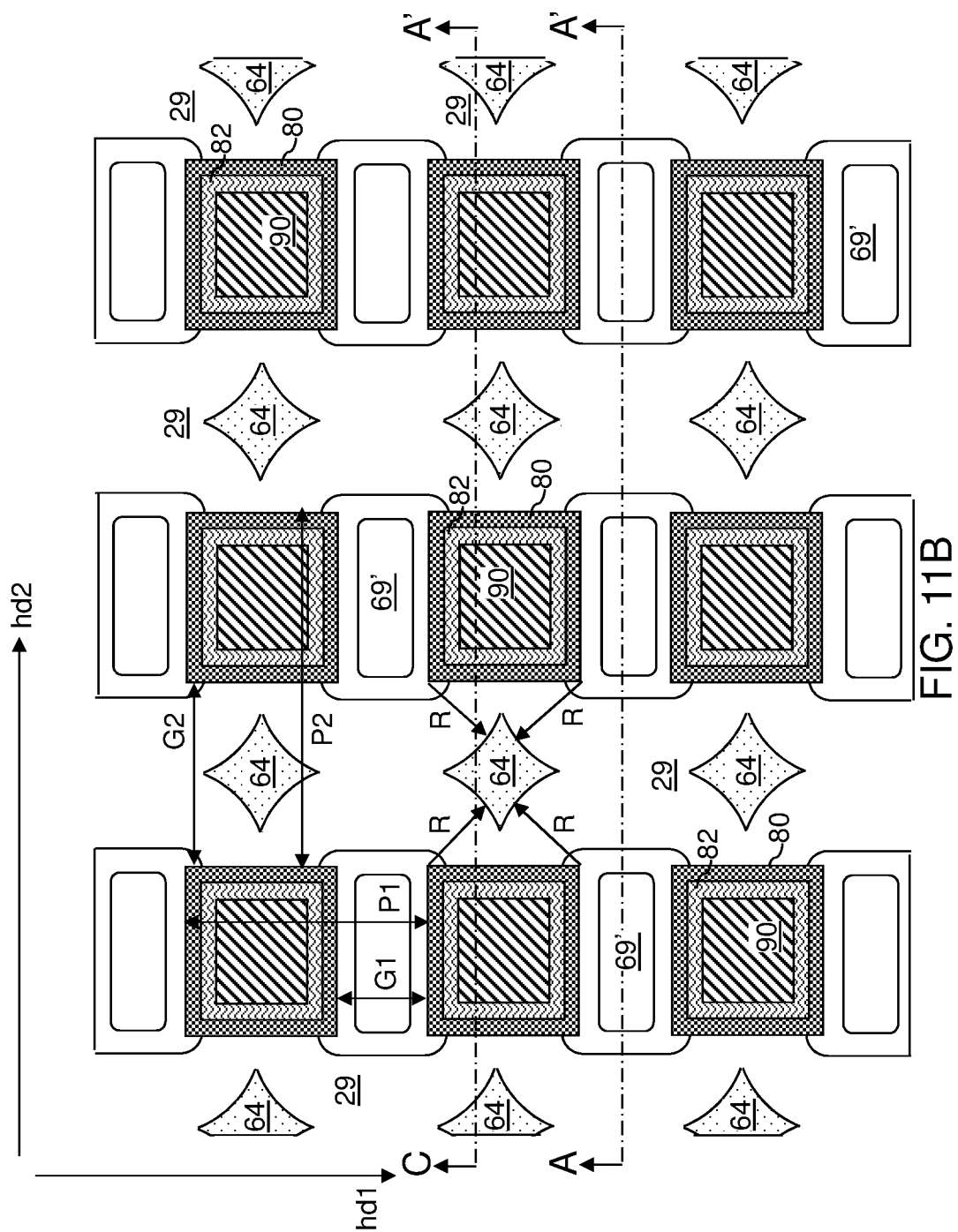
FIG. 11B is a horizontal cross-sectional view of the exemplary structure of FIG. 11A along the horizontal plane B-B'. The vertical plane A-A' is the plane of the cross-section for FIG. 11A.
Figure 11C:
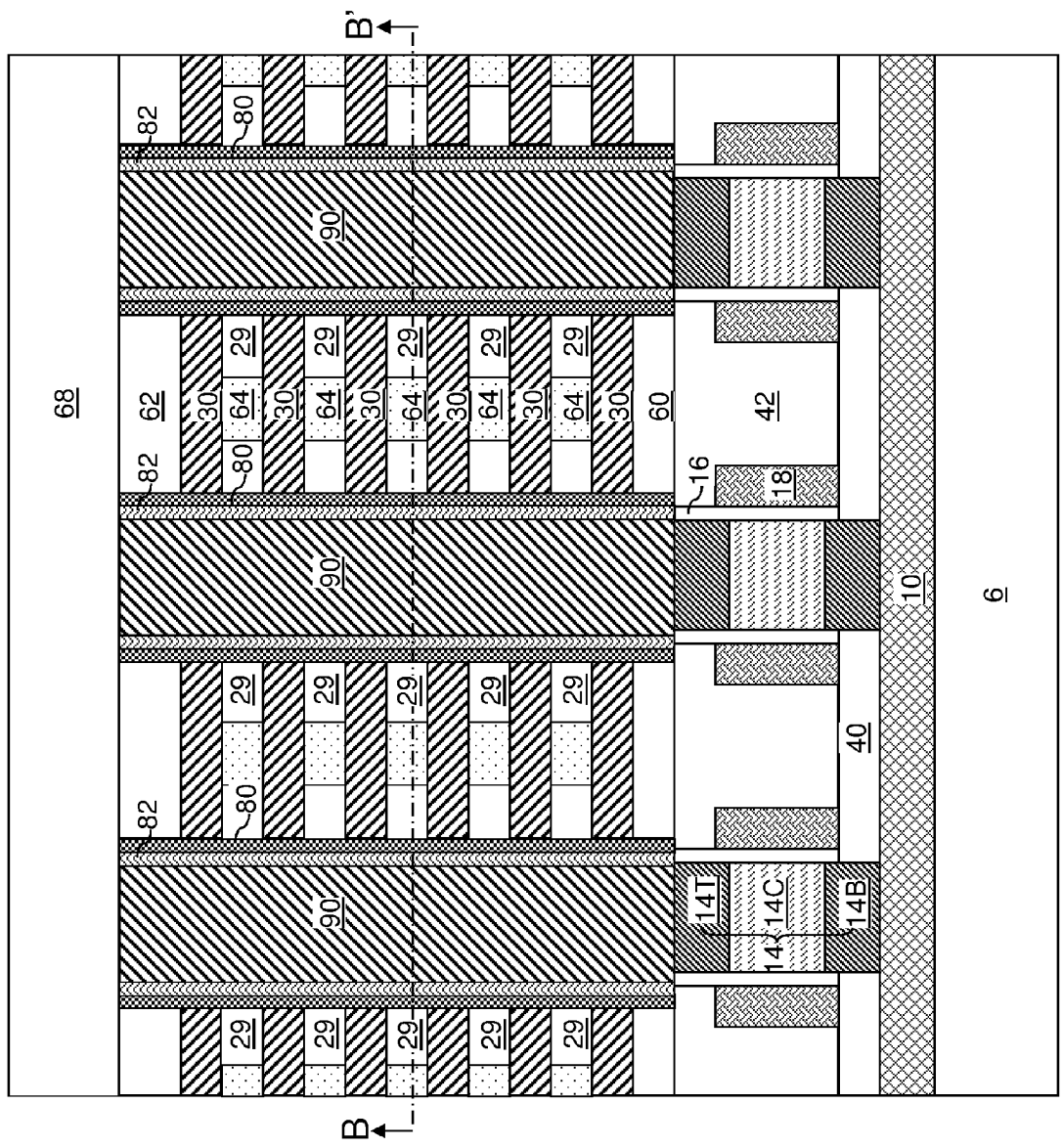
FIG. 11C is a vertical cross-sectional view of the exemplary structure of FIGS. 11A and 11B along the vertical plane C-C' in FIG. 11B.

Referring to FIGS. 11A-11C, a dielectric isolation layer 68 can be formed over the alternating stacks (30, 29) of electrically conductive layers 30 and air gaps 29 and at peripheral portions of the inter-bit-line cavities 69 by non-conformal deposition of a dielectric material. The dielectric material can be doped silicate glass, undoped silicate glass (i.e., silicon oxide), organosilicate glass, or a porous variant thereof. The dielectric material is deposited by a non-conformal and directional deposition method such as plasma enhanced chemical vapor deposition (PECVD) or plasma enhanced atomic layer deposition (PEALD). In one embodiment, the dielectric material can be deposited by a highly non-conformal deposition process that is sufficient to seal off each of the air gaps 29 with vertically extending portions of the deposited dielectric material. Further, the highly non-conformal deposition process can deposit the dielectric material at peripheral portions of each inter-bit-line cavity 69 such that a vertically-extending void 69' encapsulated by the deposited dielectric material can be formed within the inter-bit-line cavities. As used herein, a "void" refers to any volume that does not include materials in a solid phase, a liquid phase, or a plasma phase.

The dielectric isolation layer 68 includes a horizontally-extending portion 68h overlying the plurality of alternating stacks (30, 29) and a plurality of vertically-extending portions 68v that protrude downward from the horizontally-extending portion 68h into each inter-bit-line cavity 69. Further, the dielectric isolation layer 68 can include laterally-protruding portions 681 that are formed at peripheral portions of the air gaps 29. The horizontally-extending portion 68h is above the horizontal plane including the top surface of the top insulating layer 62, and includes a plurality of dimples, or recessed regions, that have curved recessed surfaces in areas that overlap with the vertically-extending voids 69'. The dimples on the top surface of the horizontally-extending portion 68h of the dielectric isolation layer 68 can be in a configuration of a two-dimensional periodic array. Each vertically-extending portion 68v can have a lateral thickness, as measured over the sidewalls of the electrically conductive layers 30, that decreases with the vertical distance from the top surface of the top insulating layer 62. Each vertically-extending portion 68v can include a bottom region having a convex top surface that provides a greater thickness with a lateral distance from the periphery thereof. Each laterally-protruding portion 681 can laterally protrude toward a remaining air gap 29. In one embodiment, each laterally-protruding portion 681 of the dielectric isolation layer 68 can have a concave sidewall having a concave profile in a vertical cross-sectional view and facing a respective air gap 29.

Each vertically-extending portion 68v of the dielectric isolation layer 68 can include a vertically-extending void 69' that extend through a predominant subset (more than 50%) of all levels within each alternating stack (30, 29). Thus, the plurality of vertically-extending portions 68v of the dielectric isolation layer 68 can include a plurality of vertically-extending voids 69' that vertically extend through a predominant subset of all levels within the plurality of alternating stacks (30, 29). Each of the plurality of vertically-extending voids 69' can be encapsulated only by a respective vertically-extending portion 68v of the dielectric isolation layer 68. As used herein, a void is encapsulated by an element if the entire set of outer surfaces of the void coincides with a set of surfaces of the element.

In an alternative embodiment, the dielectric isolation layer 68 deposition process (e.g., PECVD using a silane and oxygen containing source gases) is sufficiently non-conformal such that portions 681 are omitted and most or all of portion 68v is also omitted. In this embodiment, the dielectric isolation layer 68 includes only portion 68h or portion 68h and the upper part of portion 68v.

Figure 12:
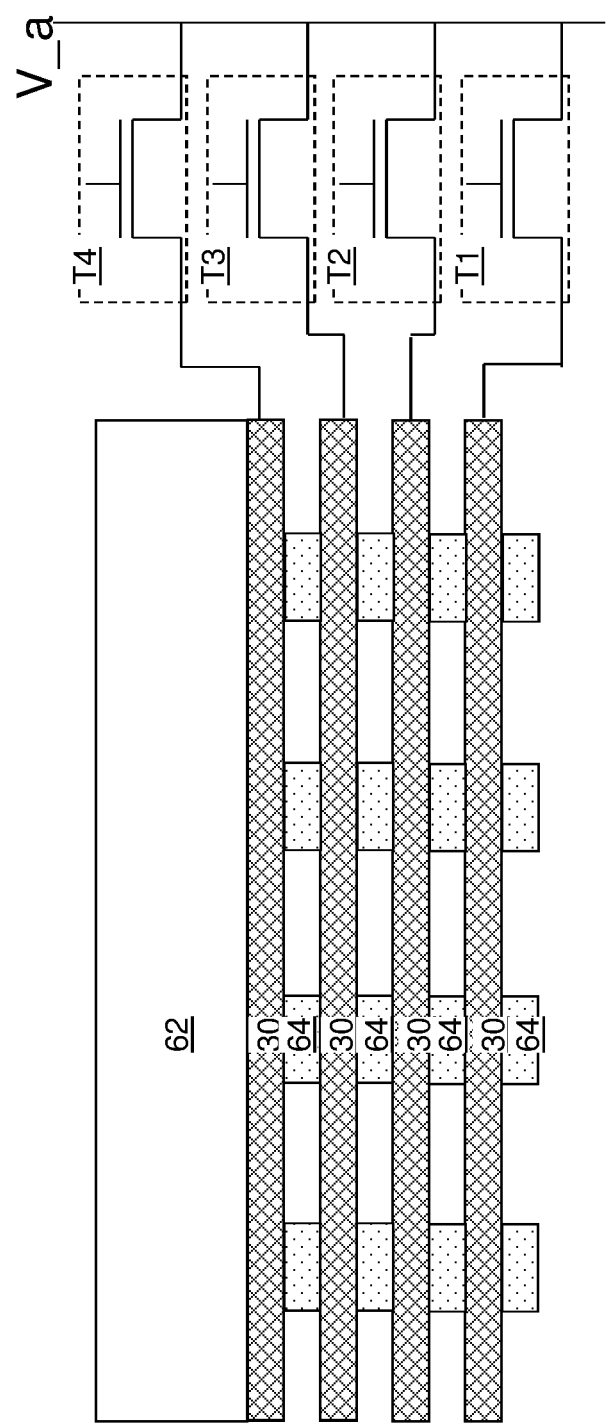
FIG. 12 is a schematic for word line access transistors connected to word lines in a resistive random access memory device.

Referring to FIG. 12, peripheral devices can be employed to access the electrically conductive layers 30 as word lines. In this case, access transistors (T1-T4) can be employed, which can electrically bias each of the electrically conductive layers 30 at a suitable electrical bias voltage (referred to as an access voltage V_a) for accessing a respective set of resistive memory elements. The vertical bit lines 90 can be accessed through the vertical field effect transistors (14B, 14C, 14T, 16, 18) and the global bit lines 10.

The exemplary structure can include a resistive memory device. The resistive memory device can include a plurality of alternating stacks (30, 29) located over a substrate 6, wherein each of the plurality of alternating stacks (30, 29) comprises word lines 30 and air gaps 29, a two-dimensional array of vertical bit lines 90 extending along a vertical direction and located among the plurality of alternating stacks (30, 29), and resistive memory material layers 80 including resistive memory elements located at intersection regions between the word lines 30 and the two-dimensional array of vertical bit lines 90.

In one embodiment, the resistive memory device further comprises a dielectric isolation layer 68 comprising a horizontally-extending portion 68h overlying the plurality of alternating stacks (30, 29) and a plurality of vertically-extending portions 68v that protrude downward from the horizontally-extending portion 68h between neighboring pairs of vertical bit lines 90 that are laterally spaced apart along a first horizontal direction hd1. In one embodiment, the plurality of vertically-extending portions 68v of the dielectric isolation layer 68 includes a plurality of vertically-extending voids 69' that vertically extend through a predominant subset of all levels within the plurality of alternating stacks (30, 29).

In one embodiment, each continuous air gap (as defined by the volume of a respective air gap 29) is laterally spaced from the plurality of vertically-extending voids 69' by the plurality of vertically-extending portions 68v of the dielectric isolation layer 68. In one embodiment, each neighboring pair of two continuous air gaps can be laterally spaced from each other by an alternating one-dimensional array of vertical bit lines 90 and a subset of the vertically-extending portions 68v that extends along the first horizontal direction hd1, which are located within a same line trench 49.

In one embodiment, each air gap 29 comprises a continuous air gap that laterally surrounds a respective set of discrete dielectric pillars 64 existing between a respective overlying word line 30 and a respective underlying word line 30. In one embodiment, a set of all discrete dielectric pillars 64 constitutes a two-dimensional array of dielectric pillars 64 having the same two-dimensional periodicity as the two-dimensional array of vertical bit lines 90. In one embodiment, each of the discrete dielectric pillars 64 comprises a respective set of vertical concave sidewalls that are adjoined to one another.

In one embodiment, each of the resistive memory material layers 80 laterally surrounds a respective vertical bit line 90. In one embodiment, each vertical concave sidewall of the discrete dielectric pillars 64 can be equidistant from a most proximal vertical edge of the resistive memory material layers 80. The separation distance therebetween can be the same as the maximum etch distance R by which the material of the dielectric material layers 61 is laterally etched during formation of the air gaps 29.

In one embodiment, the two-dimensional array of vertical bit lines 90 can comprise a rectangular array of vertical bit lines 90, the discrete dielectric pillars 64 can comprise a rectangular array of dielectric pillars 64 having the same two-dimensional periodicity as the rectangular array of vertical bit lines 90, and each of the discrete dielectric pillars 64 can comprise four vertical concave sidewalls that are adjoined to one another by vertical edges.

In one embodiment, each of the continuous air gaps of the air gaps 29 laterally extends along a first horizontal direction hd1 by a distance that is greater than the pitch (i.e., the periodicity) of the two-dimensional array of vertical bit lines along the first horizontal direction hd1, and the four vertical concave sidewalls can have a radius of curvature R (which is the same as the maximum etch distance R) that is greater than one half of a lateral separation distance (i.e., the width "a" shown in FIG. 10B) between a neighboring pair of resistive memory material layers 80 that are spaced from each other along a second horizontal direction hd2 that is perpendicular to the first horizontal direction hd1.

In one embodiment, the resistive memory device can further include an array of vertical access transistors (14T, 14C, 14B, 16, 18) including a first node (e.g., the top active region 14T) electrically connected to, and contacting, a respective one of the vertical bit lines 90, and global bit lines 10 laterally spaced apart along a first horizontal direction hd1 and extending along a second horizontal direction hd2. A second node (e.g., the bottom active region 14B) of each one-dimensional array of vertical access transistors arranged along the second direction hd2 (i.e., underlying a same line trench 49) is electrically connected to a respective one of the global bit lines 10. The optional steering element layers 82 can contact the respective resistive memory material layers 80 in the resistive memory device.

In one embodiment, each resistive memory material comprises a material selected from a metal oxide material providing variable electrical resistivity depending on density of oxygen vacancies therein, a chalcogenide phase change material, or a filament-forming dielectric oxide material that provides a reversible increase in electrical conductivity upon formation of conductive filaments therein.

The air gaps 29 of the exemplary structure of the present disclosure reduce capacitive coupling between vertically neighboring pairs of word lines 30, and thus, reduce the RC signal delay time for the word lines 30. Further, the vertically-extending voids 69' provided within each vertically-extending portion 68v of the dielectric isolation layer 68 reduce capacitive coupling between the vertical bit lines 90, and between each vertical bit line 90 and adjacent portions of the word lines 30. Thus, the RC signal delay time for the vertical bit lines 90 can also be reduced due to the presence of the vertically-extending voids 69'.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A resistive memory device comprising:
   a plurality of alternating stacks located over a substrate, wherein each of the plurality of alternating stacks comprises word lines and air gaps;
   a two-dimensional array of vertical bit lines extending along a vertical direction and located among the plurality of alternating stacks;
   resistive memory material layers including resistive memory elements located at intersection regions between the word lines and the two-dimensional array of vertical bit lines; and
   a dielectric isolation layer comprising a horizontally-extending portion overlying the plurality of alternating stacks and a plurality of vertically-extending portions that protrude downward from the horizontally-extending portion between neighboring pairs of vertical bit lines that are laterally spaced apart along a first horizontal direction.

2. The resistive memory device of claim 1, wherein the plurality of vertically-extending portions of the dielectric isolation layer includes a plurality of vertically-extending voids that vertically extend through a predominant subset of all levels within the plurality of alternating stacks.

3. The resistive memory device of claim 2, wherein each air gap is laterally spaced from the plurality of vertically-extending voids by the plurality of vertically-extending portions of the dielectric isolation layer.

4. The resistive memory device of claim 1, wherein each neighboring pair of two air gaps is laterally spaced from each other by an alternating one-dimensional array of vertical bit lines and a subset of the vertically-extending portions that extends along a first horizontal direction.

5. The resistive memory device of claim 1, wherein each air gap comprises a continuous air gap that laterally surrounds a respective set of discrete dielectric pillars extending between a respective overlying word line and a respective underlying word line.

6. The resistive memory device of claim 5, wherein:
each of the discrete dielectric pillars comprises a respective set of vertical concave sidewalls that are adjoined to one another;
each of the resistive memory material layers laterally surrounds a respective vertical bit line; and
each vertical concave sidewall of the discrete dielectric pillars is equidistant from a most proximal vertical edge of the resistive memory material layers.

7. The resistive memory device of claim 6, wherein:
the two-dimensional array of vertical bit lines comprises a rectangular array of vertical bit lines;
the discrete dielectric pillars comprise a rectangular array of dielectric pillars having a same two-dimensional periodicity as the rectangular array of vertical bit lines; and
each of the discrete dielectric pillars comprises four vertical concave sidewalls that are adjoined to one another by vertical edges.

8. The resistive memory device of claim 7, wherein:
each of the continuous air gaps laterally extends along a first horizontal direction by a distance that is greater than a pitch of the two-dimensional array of vertical bit lines along the first horizontal direction; and
the four vertical concave sidewalls have a radius of curvature that is greater than one half of a lateral separation distance between a neighboring pair of resistive memory material layers that are spaced from each other along a second horizontal direction that is perpendicular to the first horizontal direction.

9. The resistive memory device of claim 1, further comprising:
steering element layers contacting the respective resistive memory material layers;
an array of vertical access transistors including a first node electrically connected to a respective one of the vertical bit lines; and
global bit lines laterally spaced apart along a first horizontal direction and extending along a second horizontal direction, wherein a second node of each one-dimensional array of vertical access transistors arranged along the second direction is electrically connected to a respective one of the global bit lines.

10. The resistive memory device of claim 1, wherein each resistive memory material layer comprises a material selected from:
a metal oxide material providing variable electrical resistivity depending on density of oxygen vacancies therein;
a chalcogenide phase change material; or
a filament-forming dielectric oxide material that provides a reversible increase in electrical conductivity upon formation of conductive filaments therein.

11. A resistive memory device comprising:
a plurality of alternating stacks located over a substrate, wherein each of the plurality of alternating stacks comprises word lines and air gaps;
a two-dimensional array of vertical bit lines extending along a vertical direction and located among the plurality of alternating stacks; and
resistive memory material layers including resistive memory elements located at intersection regions between the word lines and the two-dimensional array of vertical bit lines,
wherein each air gap comprises a continuous air gap that laterally surrounds a respective set of discrete dielectric pillars extending between a respective overlying word line and a respective underlying word line.

12. The resistive memory device of claim 11, further comprising a dielectric isolation layer comprising a horizontally-extending portion overlying the plurality of alternating stacks and a plurality of vertically-extending portions that protrude downward from the horizontally-extending portion between neighboring pairs of vertical bit lines that are laterally spaced apart along a first horizontal direction.

13. The resistive memory device of claim 12, wherein the plurality of vertically-extending portions of the dielectric isolation layer includes a plurality of vertically-extending voids that vertically extend through a predominant subset of all levels within the plurality of alternating stacks.

14. The resistive memory device of claim 13, wherein each air gap is laterally spaced from the plurality of vertically-extending voids by the plurality of vertically-extending portions of the dielectric isolation layer.

15. The resistive memory device of claim 12, wherein each neighboring pair of two air gaps is laterally spaced from each other by an alternating one-dimensional array of vertical bit lines and a subset of the vertically-extending portions that extends along a first horizontal direction.

16. The resistive memory device of claim 11, wherein:
each of the discrete dielectric pillars comprises a respective set of vertical concave sidewalls that are adjoined to one another;
each of the resistive memory material layers laterally surrounds a respective vertical bit line; and
each vertical concave sidewall of the discrete dielectric pillars is equidistant from a most proximal vertical edge of the resistive memory material layers.

17. The resistive memory device of claim 16, wherein:
the two-dimensional array of vertical bit lines comprises a rectangular array of vertical bit lines;
the discrete dielectric pillars comprise a rectangular array of dielectric pillars having a same two-dimensional periodicity as the rectangular array of vertical bit lines; and
each of the discrete dielectric pillars comprises four vertical concave sidewalls that are adjoined to one another by vertical edges.

18. The resistive memory device of claim 17, wherein:
each of the continuous air gaps laterally extends along a first horizontal direction by a distance that is greater than a pitch of the two-dimensional array of vertical bit lines along the first horizontal direction; and
the four vertical concave sidewalls have a radius of curvature that is greater than one half of a lateral separation distance between a neighboring pair of resistive memory material layers that are spaced from each other along a second horizontal direction that is perpendicular to the first horizontal direction.

19. The resistive memory device of claim 11, further comprising:

steering element layers contacting the respective resistive memory material layers;

an array of vertical access transistors including a first node electrically connected to a respective one of the vertical bit lines; and global bit lines laterally spaced apart along a first horizontal direction and extending along a second horizontal direction, wherein a second node of each one-dimensional array of vertical access transistors arranged along the second direction is electrically connected to a respective one of the global bit lines.

20. The resistive memory device of claim 11, wherein each resistive memory material layer comprises a material selected from:

a metal oxide material providing variable electrical resistivity depending on density of oxygen vacancies therein;

a chalcogenide phase change material; or a filament-forming dielectric oxide material that provides a reversible increase in electrical conductivity upon formation of conductive filaments therein.

\* \* \* \* \*